(12) United States Patent
Osone et al.

(10) Patent No.: US 7,656,030 B2
(45) Date of Patent: Feb. 2, 2010

(54) SEMICONDUCTOR DEVICE

(75) Inventors: Yasuo Osone, Kasumigaura (JP); Kenya Kawano, Hitachinaka (JP); Chiko Yorita, Fujisawa (JP); Yu Hasegawa, Saku (JP); Yuji Shirai, Hamura (JP); Naotaka Tanaka, Kasumigaura (JP); Seiichi Tomoi, Saku (JP); Hiroshi Okabe, Koganei (JP)

(73) Assignee: Renesas Technology Corp., Tokyo (JP)

( * ) Notice: Subject to any disclaimer, the term of this patent is extended or adjusted under 35 U.S.C. 154(b) by 448 days.

(21) Appl. No.: 11/652,235

(22) Filed: Jan. 10, 2007

(65) Prior Publication Data

US 2007/0176298 A1    Aug. 2, 2007

(30) Foreign Application Priority Data

Jan. 11, 2006  (JP)  ............................. 2006-003195

(51) Int. Cl.
*H01L 23/34* (2006.01)
*H01L 23/48* (2006.01)

(52) U.S. Cl. ..................... 257/728; 257/723; 257/706; 257/713; 257/777; 257/E23.174

(58) Field of Classification Search ................. 257/728, 257/723, 706, 713, 777, E23.174
See application file for complete search history.

(56) References Cited

U.S. PATENT DOCUMENTS

| 6,507,110 | B1 * | 1/2003 | Chen et al. ................... 257/728 |
| 7,230,316 | B2 * | 6/2007 | Yamazaki et al. ............ 257/531 |
| 7,396,701 | B2 * | 7/2008 | Shigemura et al. .......... 438/108 |
| 7,554,167 | B2 * | 6/2009 | Vaganov ..................... 257/415 |
| 2005/0180122 | A1 * | 8/2005 | Okabe ........................ 361/803 |

FOREIGN PATENT DOCUMENTS

| JP | 2000-031309 | 1/2000 |
| JP | 2001-035994 | 2/2001 |
| JP | 2001-102483 | 4/2001 |
| JP | 2004-071597 | 3/2004 |

* cited by examiner

*Primary Examiner*—Nitin Parekh
(74) *Attorney, Agent, or Firm*—Townsend and Townsend and Crew LLP

(57) ABSTRACT

Heating elements different in heat generating timing are laminated in a stacked state, and the heating element close to a wiring substrate is allowed to function as a heat diffusion plate for another heating element.

6 Claims, 42 Drawing Sheets

SEMICONDUCTOR DEVICE

CROSS-REFERENCE TO RELATED APPLICATION

The present application claims priority from Japanese Patent Application No. JP 2006-003195 filed on Jan. 11, 2006, the content of which is hereby incorporated by reference into this application.

TECHNICAL FIELD OF THE INVENTION

The present invention relates to a heat dissipation design technique for a radio frequency transmitting and receiving semiconductor device mounted on a mobile information terminal such as a mobile phone.

BACKGROUND OF THE INVENTION

As a technique regarding a heat dissipation design for a radio frequency transmitting and receiving power semiconductor device mounted on a mobile information terminal such as a mobile phone, a mounting structure for reducing the heat resistance is disclosed, for example, in Japanese Patent Application Laid-Open Publication No. 2001-102483 (Patent Document 1) and Japanese Patent Application Laid-Open Publication No. 2004-71597 (Patent Document 2). From among these documents, the mounting structure disclosed in the Patent Document 1, as shown in the sectional view shown in FIG. 1 has a face-up structure in which a circuit forming region (active region) of a semiconductor element 1 is located on an element, and moreover, adapts a system in which a heat conducting member which is a connecting member is used between the element bottom and a wiring substrate, and this heat conducting member functions as a so-called heat diffusion plate.

On the other hand, the mounting structure disclosed in the Patent Document 2, similarly to the sectional view shown in FIG. 2, is a structure in which a plurality of semiconductor elements are laminated on the wiring substrate by a face down system that directs the active region to the element bottom side, that is, a flip-chip connecting system. In this case, a system is adapted such that a power semiconductor element large in heat value is disposed on the lowest part of the power semiconductor device, and radiates heat directly to the wiring substrate by a bump structure of a large area exclusive for heat dissipation.

One example of the structure that improves heat dissipation of the semiconductor elements laminated in a stacked state is disclosed in Japanese Patent Application Laid-Open Publication No. 2000-31309 (Patent Document 3) and Japanese Patent Application Laid-Open Publication No. 2001-35994 (Patent Document 4).

SUMMARY OF THE INVENTION

In the prior art disclosed in the Patent Document 1, a heat conducting member to function as a heat diffusion plate includes only an earth function that connects a semiconductor element rear surface and a wiring substrate in circuit-wise, and there is a problem that when signal wirings are provided by means such as wire bonding, a mounting area becomes large. Further, addition of the heat diffusion plate invites an increase in the number of parts and connecting members as well as the mounting process thereof, thereby causing a problem of increasing the cost of products. Furthermore, since it is presumed that a number of semiconductor elements are basically dispersed and mounted on a flat surface, there is a problem that the semiconductor device for mobile information terminal for which high functionalization and miniaturization are in great demands in the market is unable to cope with miniaturization due to an increase in the mounting area when the number of parts and functions per each element are increased.

On the other hand, in the prior art disclosed in the Patent Document 2, while the problem of miniaturization can be solved, there is a need to fit semiconductor elements that mainly generate heat into the wiring substrate, and this makes the manufacturing process complicated, and causes a problem of the cost of products becoming high.

In the mounting structure disclosed in the Patent Document 3, with respect to the semiconductor elements laminated in a stacked state, though a structure that dissipates heat to the lower part of a module through a lead frame and a structure that is connected to the rear surface of the semiconductor element and dissipates heat by using a heat sink exposed to the undersurface of the module are disclosed, a location remote from the undersurface of the module, that is, a heat dissipation route of the element on the upper surface of the module is structured such that the lead frame is indispensable, and there is a problem that it is difficult to dissipate heat from the element on the upper surface without the lead frame.

Since the Patent Document 3 relates originally to an invention for a chip size packaging for memory, in terms of the problem as to which and when anyone of the memory elements laminated in a stacked state starts heating, it presupposes that any element substantially and simultaneously dissipates heat to the same extent. However, in the case of the element such as a power amplifier (power amp) used for transmission and reception of the mobile phone, it is common that the elements dissipating heat at different time zone and place depending on the frequency bands and standards to be used are mixedly loaded in one semiconductor device (module), and in order to miniaturize and highly functionalize the mixedly loaded mounting structure of the semiconductor device such as a power amp, which is large in heat value and generates heat at different timing, there has been a problem that the lead frame is not necessarily effective.

In a laminating structure of the semiconductor integrated circuit device disclosed in the Patent Document 4, the semiconductor element at the side (lower part) close to the wiring substrate is connected by flip-chip connection, and the semiconductor element at the side (upper side) far from the wiring substrate is connected by wire bonding, and the space between the semiconductor elements is bonded by conductive bonding agent. The semiconductor integrated circuit device of the Patent Document 4, similarly to the Patent Document 3, is mounted with a memory element, and moreover, when seen from the semiconductor element at the side far from the wiring substrate, the semiconductor element at the side close to the wiring substrate does not function as the heat diffusion plate, and therefore, there has been a problem that unless an auxiliary heat diffusion function is used, heat resistances of the semiconductor elements which are memories at the side close to and far from the wiring substrate have causes a large difference with each other.

FIG. 3 is a block system unit showing an outline of a signal processing circuit mounted on a mobile information terminal such as a mobile phone. A signal transmitting and receiving circuit of the mobile information terminal mainly includes an antenna b01 that transmits and receives an electric wave by radio functions, a duplexer (branching filter) b02a or an antenna switch b01b that sends a signal received from the antenna to a receiving circuit b03 and also sends a signal transmitted from a transmitting circuit b04 to the antenna, a receiving circuit, a baseband signal processing circuit (a baseband LSI: Large Scale Integrated Circuit) b05 that processes a receiver signal of the receiver circuit b03, a transmitting circuit that converts a signal outputted from the baseband LSI into a transmitting signal, VCOs (voltage controlled Oscillator) b06 and b07 for controlling the receiving circuit and the transmitting circuit, and a PLL synthesizer (Phase-locked Loop) b08 or the like. From among these parts, the parts that do not include the baseband LSI-b05 are generally referred to as a RF unit (Radio Frequency Unit) b20. The baseband LSI-b05, in addition to the RF unit, is mutually connected to a memory b09, a display and input unit b10, a voice processing unit b11, an external interface b12, a power management supply source b13, and the like, and in order to manage these applications, a CPU (Central Processing Unit), an application processor, and the like are used. The unit including the baseband LSI-b05 and the CPU-b14 is referred to as a baseband unit b21.

FIG. 4 shows an outline of the signal processing circuit classified broadly into the RF unit b20 and the baseband unit b21.

The receiver signal received by the antenna b01 passes through a filter b22 such as BPF (Band Pass Filter) from the branching filter (duplexer) b02a or the antenna switch b02b and arrives at the receiving circuit b03, and is converted into a frequency that can be processed by the baseband unit b21 in the receiving circuit b21. An output signal processed in the baseband unit b21 is converted into an antenna transmission frequency in an output circuit b04, and is sent to the antenna b01 after it is amplified by a power amp b23. Incidentally, when the signal output is small, there is a system available, in which no power amp b23 exists, but with respect to each of communication standards and frequency bands such as GSM (Global system for Mobile Communication) which is a mobile phone system of 2.5 generation, PDC (Personal Digital Cellular) or CDMA (Code Division Multiple Accesses), and W-CDMA (Wideband CDMA) which is a developed system of the CDMA, the power amp is used for amplification of the transmitting signal, and heat generation of the element due to its loss becomes a big problem.

In the block system diagram shown in FIG. 4, an integrated circuit that converts an antenna receiver signal into a frequency that can be processed by the baseband unit b21, and converts the signal sent from the baseband unit b21 into an antenna transmitting frequency is taken as a RF-IC (Radio Frequency-Integrated Circuit) b30. The range surrounded by a broken line of FIG. 4 is the RF-IC in a narrow sense. Incidentally, in the block system diagrams shown in FIGS. 3 and 4, while a circuit structure only of specific frequency band/standard is shown, with respect to the circuit structures of a plurality of frequency bands and standards, the RF-IC and baseband unit are common, and the antenna, branching filter or antenna switch, filter types, power amp and the like are commonly shared with a part of the circuits, while being disposed in parallel, and according to the frequency bands and standards, the circuits are used by being switched over.

With respect to the power amp also, the case where a coulometric amplifier per each frequency band and standard is formed on each separate semiconductor element so as to be mounted into one module, the case where the power amplifier per each frequency band and standard is formed on each separate semiconductor element so as to be mounted into a different module, and the case where, from among the power amps per each frequency band and standard, the power amps corresponding to a plurality of frequency bands and standards are formed in parallel within one semiconductor element so as to be mounted into one module, and a combination of these cases are conceivable. Further, even when the power amps corresponding to the plurality of frequency bands and standards are formed in parallel within one semiconductor element, there exists also the case where the control unit and current amplifying unit of a current amplifier circuit are formed in separate elements and mounted into one module.

On the other hand, when a high frequency radio communication circuit capable of corresponding to a plurality of radio communication standards such as mobile phone (GSM system, internal PDC system, CDMA system, W-CDMA system, and TD-CDMA (Time Division-Code Division Multiple Access) and the like), PHS (Personal Handyphone System), Radio LAN (Local Area Network), and UWB (Ultra Wideband) is mounted on the mobile information terminal such as the mobile phone, mutual connection between mobile phone suppliers by roaming, mutual utilization of the standards of a plurality of generations within the same suppliers where, for example, 2.5 generations of the GSM system and 3 generations of the W-CDMA system coexist depending on the regions, or selection of the standards communicatable at the fastest speed and lowest power consumption at the information communication time are made possible, thereby making it possible to contribute to high functionalization of the terminal.

In contrast to this, such highly functionalized high frequency radio communication circuit has the number of parts increased after all even if sharing of parts and circuits is promoted, and there arises a problem that the mounting area of the circuit ends up becoming larger.

The functions required in the mobile information terminal are not only just voice/image communications and information communications, but also include a watch, game, schedule management, photographing of moving and still images, data editing, document preparation, settlement mechanism such as credit function, personal authentication function, reproducing function of downloaded music and pictures, security function such as locking management of the home, operating function of home appliances, or storage function of various data, and these functions tend to increase at an accelerating pace. For this reason, even when the highly functionalized high frequency radio communication circuit corresponding to the plurality of standards and frequency bands as described above is mounted, it is necessary to reduce the mounting area as much as possible.

To make highly intelligent functions and reduction in the mounting area compatible, reduction in the number of parts and stacked mount are required. However, there exists a problem that, when the stacked mount is carried on, the temperature of the part at a distant position seen from the circuit substrate of a mobile information terminal main body, that is, a so-called mother board, that is, the temperature of the part disposed on the surface far away from a surface having a connecting unit with the mother board is apt to rise. Further, in general, the cost of the semiconductor device is apt to rise when it is highly functionalized, and goes down when the mounting area becomes smaller, but the cost lowering pressure by the reduction in the mounting area is apt to be stronger than the cost rising pressure by high functionalization. Consequently, granted that the mounting area can be reduced or that a structure capable of inhibiting the temperature rise of the parts can be realized, there is a need to avoid the rise of the material cost of the product as much as possible by adding new parts for that reason.

As means for solving such problems, in the semiconductor device mounted with a transmission power amplifier (power amp) from among the high frequency radio communication circuits used for the mobile information terminal such as the mobile phone, since it is rarely the case that the signals of a plurality of frequency bands are simultaneously amplified or the circuits of a plurality of standards are simultaneously used, a structure is adopted in which the semiconductor elements that separately generate heat at the different time zones or at different regions are laminated in a stacked state, and moreover, the semiconductor element at the side close to the wiring substrate is allowed to function as a the heat diffusion plate seen from the semiconductor element at the side far away from the wiring substrate, and further, even when the RF-IC (radio frequency integrated circuit) and the power amp are mounted in a stacked state, the power amp having a large heat value is mounted on the RF-IC and the RF-IC is allowed to function as the heat diffusion plate seen from the power amp, so that high functionalization and miniaturization are realized and the increase in the heat resistance accompanied with the miniaturization can be suppressed.

BRIEF DESCRIPTIONS OF THE DRAWINGS

DESCRIPTIONS OF THE PREFERRED EMBODIMENTS

First Embodiment

Figure 4:
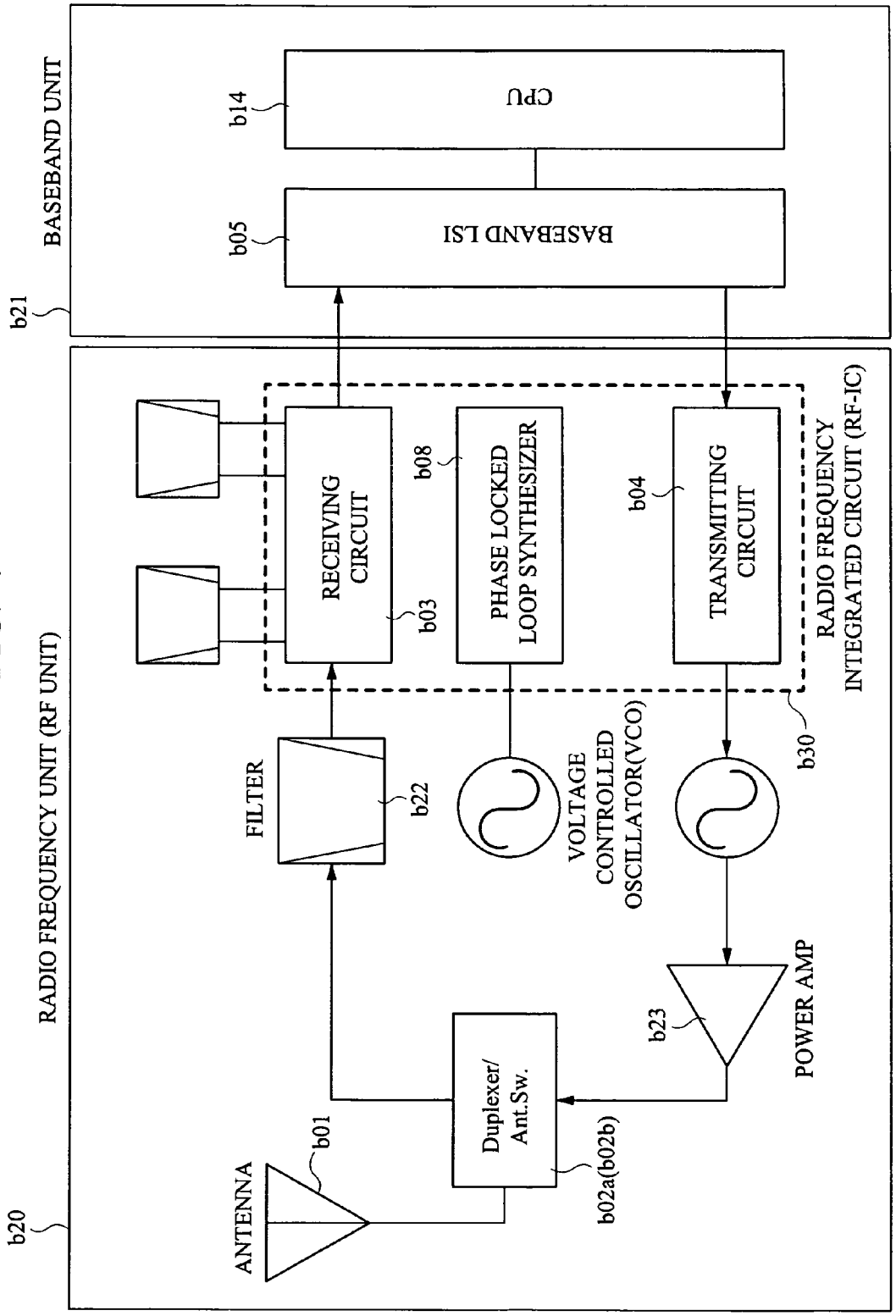
FIG. 4 is a block system diagram showing an outline of the signal processing circuit to be mounted on the mobile information terminal of the present invention.
Figure 5:
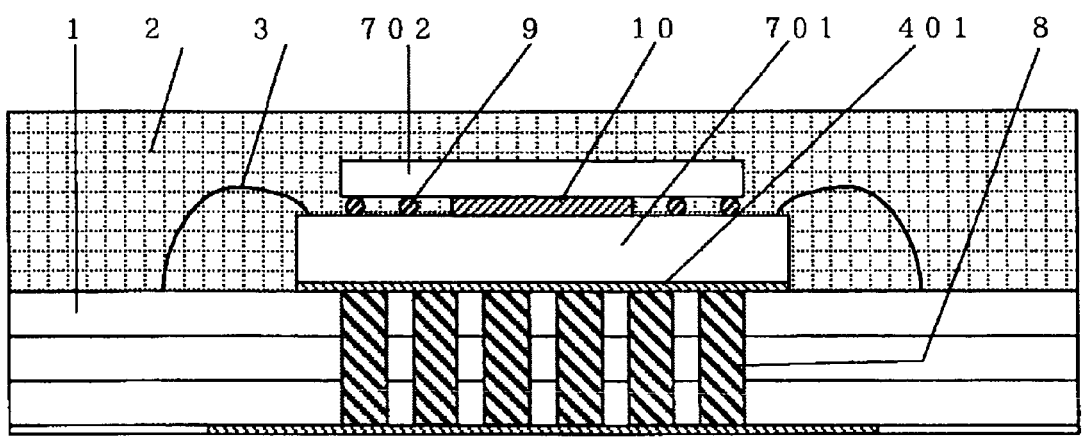
FIG. 5 is a sectional view showing a mounting structure of a power amp to be mounted on the mobile information terminal of the present invention.
Figure 6:
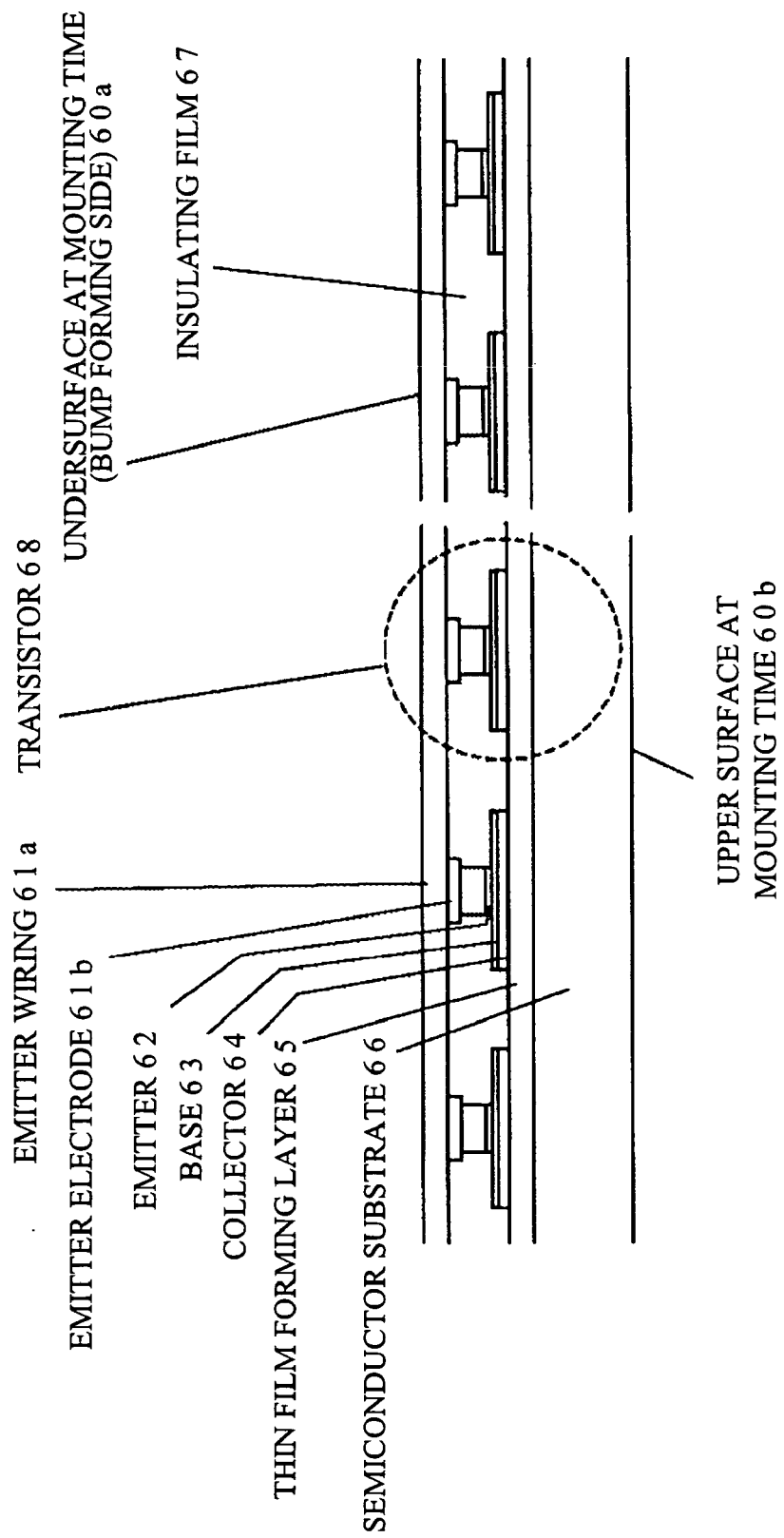
FIG. 6 is a view showing one example of an element sectional structure of a bipolar transistor from among power amps to be mounted on the mobile information terminal of the present invention.
Figure 7:
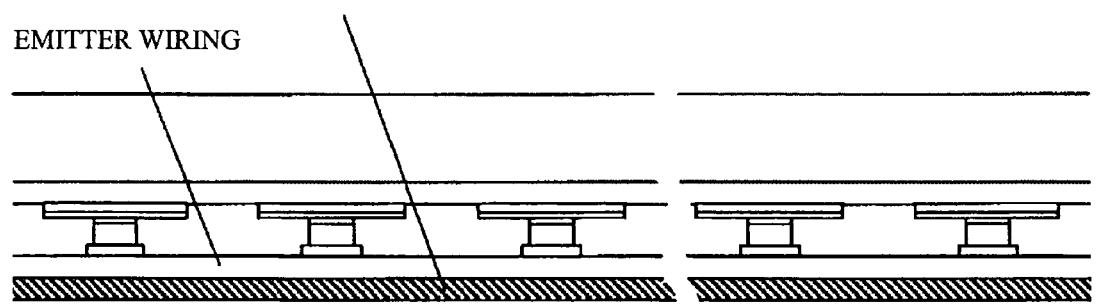
FIG. 7 is a view showing an example in which a combination heat dissipation and large area bump is formed on an emitter wiring of the bipolar transistor from among the power amps to be mounted on the mobile information terminal of the present invention.

The embodiment of the present invention will be described with reference to FIGS. 4 to 11. FIG. 4 is a block system diagram showing the outline of a signal processing circuit mounted on a mobile information terminal in the present embodiment, and a semiconductor device in the present embodiment takes a power amp of FIG. 4 as a target. FIG. 5 is a sectional view showing a mounting structure of a power amplifier (power amp) in the present embodiment, FIG. 6 is a view showing one example of an element sectional structure of a bipolar transistor from among the power amplifiers in the present embodiment, FIG. 7 is a sectional view showing an example forming a combination heat dissipation and large area bump on an emitter wiring when the bipolar transistor of FIG. 6 is flip-chip mounted, and FIG. 8 is a view in the case where one example of signal pad electrode and an amplifier circuit seen from the element surface side of the bipolar transistor.

Figure 9:
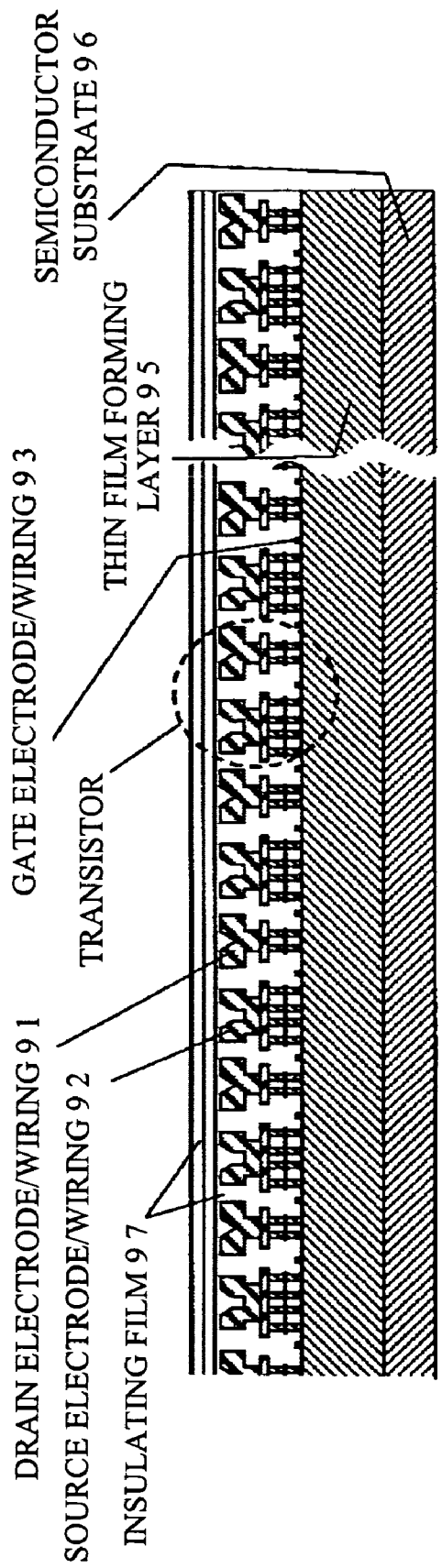
FIG. 9 is a view showing one example of the element sectional structure of a metal oxide film semiconductor from among the power amps to be mounted on the mobile information terminal of the present invention.
Figure 10:
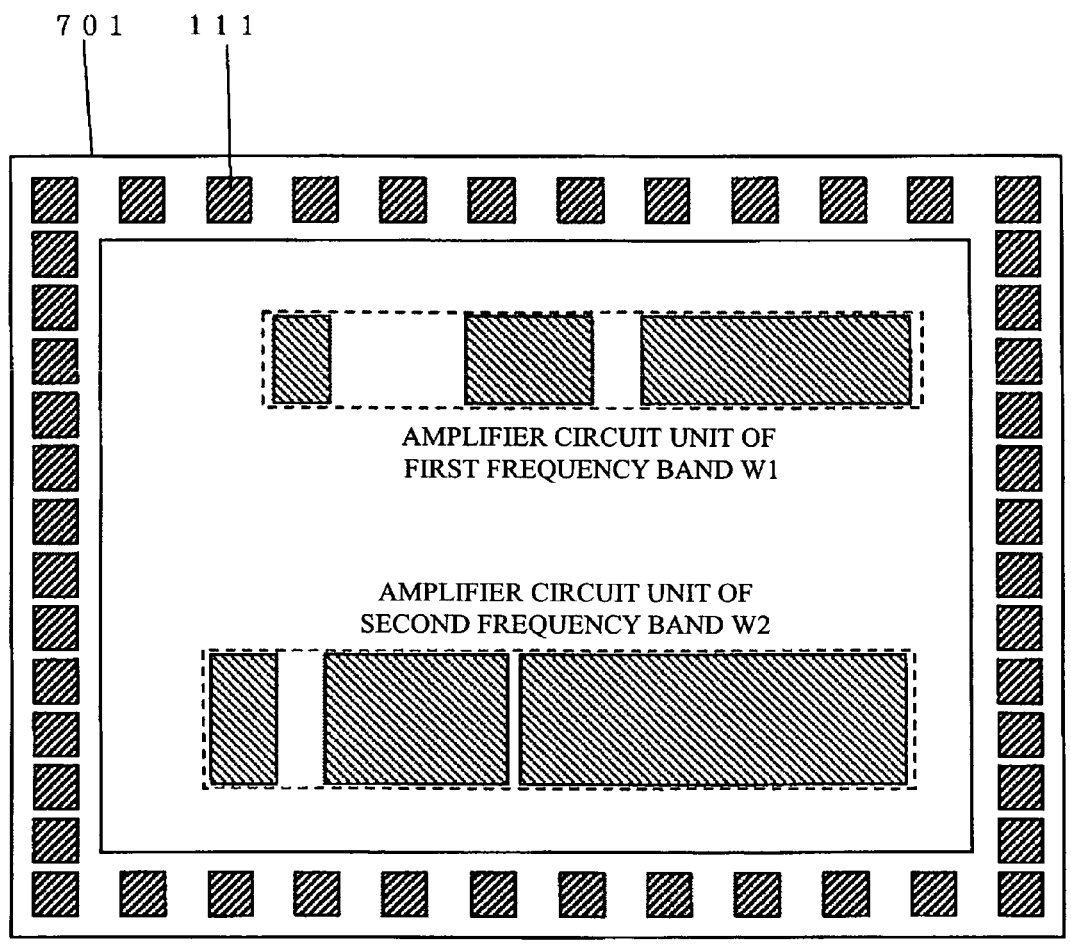
FIG. 10 is a view of the case where one example of the signal pad electrode and the amplifier circuit is seen from the element surface side of the metal oxide film semiconductor from among the power amps to be mounted on the mobile information terminal of the present invention.

On the other hand, FIG. 9 is a view showing one example of an element sectional structure of a MOS (Metal Oxide Semiconductor) from among the power amplifiers in the present embodiment and FIG. 10 is a view in the case where one example of a signal pad electrode and an amplifier circuit seen from the element surface of the metal oxide semiconductor.

Incidentally, in FIGS. 5 to 10, the number of signal connecting bump pad electrodes 111 and combination heat dissipation and large area bump pad electrodes 112 are not necessarily matched, but it strictly shows one example, and as shown in FIG. 5, when the entire device is mounted, the electrodes, the connecting bumps 9 and the combination heat dissipation and large area bumps 10 may be formed neither more nor less. Although there are circuit units and wirings which are not actually illustrated, since they do not contribute much as heat dissipation routes, they are omitted in FIGS. 5 to 10.

Figure 8:
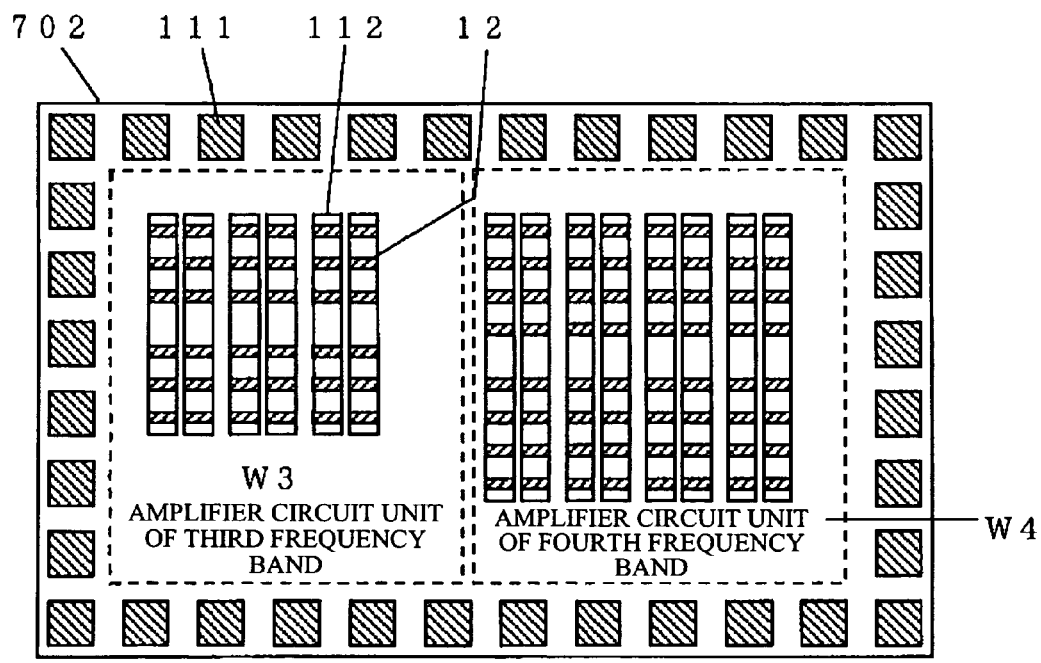
FIG. 8 is a view in the case where one example of a signal pad electrode and an amplifier circuit are seen from an element surface side of the bipolar transistor from among the power amps to be mounted on the mobile information terminal of the present invention.

Further, in FIGS. 8 and 10, though the amplifier circuit units of first to fourth frequency bands are shown to exist, respectively, these are not necessary required to match with the Figures. For example, the power amp circuit unit formed on the semiconductor element of either of FIGS. 8 and 10 or both of them may correspond to one frequency band and standard or may correspond to three or more than three frequency bands and standards instead of two frequency bands and standards as shown in the Figures. Further, a combination of the semiconductor elements of FIGS. 8 and 10 may correspond to one or more frequency bands and standards. In either case, the present embodiment is characterized in that the semiconductor element 7 having the power amp circuit unit as shown in FIGS. 8 and 10 is mounted in a stacked state on the wiring substrate 1 as shown in FIG. 5.

In the present embodiment shown in FIG. 5, a first semiconductor element 701 is connected to the wiring substrate 1 by a first connecting member 401 composed of solder and conductive bonding agent. A circuit formation area (active region) of the first semiconductor element 701 is formed over the upper side of FIG. 5 which is opposed to the semiconductor element contacted with a first connecting member 401. The first semiconductor element, for example, has a MOS (metal oxide film semiconductor) structure as shown in FIGS. 9 and 10, and is connected to other pad electrodes over the wiring substrate 1 through a bonding wire 3 from signal connecting pad electrode 111 formed in the peripheral portion of FIG. 10, and exchanges electrical signals with the pad electrodes.

The wiring substrate 1 is composed of a plurality of layers in FIG. 5, and is structured to have heat dissipation thermal via 8. As the material of this substrate, it does not matter if it is of an organic resin substrate or a ceramic baked substrate. The number of layers thereof is not necessary of multi layers similarly to the Figures, and non-existence of the thermal via 8 is permitted if the temperature rise due to heat generation of the mounted semiconductor element can be kept under the desired temperature.

In FIG. 5, over a first semiconductor element 701, a second semiconductor element 702 is mounted by using a signal connecting bump 9 and a combination heat dissipation and large area bump 10. As the second semiconductor element 702, for example, as shown in FIGS. 6, 7, and 8, a bipolar transistor is used. This bipolar transistor is mounted by connection of faced down flip-chip opposed to the first semiconductor element 701 and the wiring substrate 1 with the active region which is a circuit forming surface located at the downside of the Figure. Although the exchange of the signal with the second semiconductor element 702 is not shown in the Figure, the signal is nevertheless transferred to the wiring substrate 1 by a bonding wire 3 through a wiring layer formed over the upper side surface of the Figure of the first semiconductor element. Incidentally, as an example of the second semiconductor element 702, a HBT (Hetero Junction Bipolar Transistor) formed on a gallium arsenide substrate and the like are conceivable.

The present embodiment shown in FIG. 5 is characterized in that the first semiconductor element 701 functions as a heat dissipation route, particularly as a heat diffusion plate of the heat generated as a loss from the second semiconductor element 702. Hence, even when the semiconductor element formed on the gallium arsenide substrate having heat conductance smaller than the silicon substrate is used as the second semiconductor element 702, the heat arisen from the element is first transferred to the first semiconductor element 701 through the combination heat dissipation and large area bump 10, and is diffused by the first semiconductor element 701 in the horizontal direction of FIG. 5, and after that, it is transferred to the wiring substrate 1. For this reason, for example, heat arisen from the second semiconductor element 702 can be transferred to more thermal vias 8, and therefore, the temperature rise of the second semiconductor element 702 can be effectively suppressed.

Figure 1:
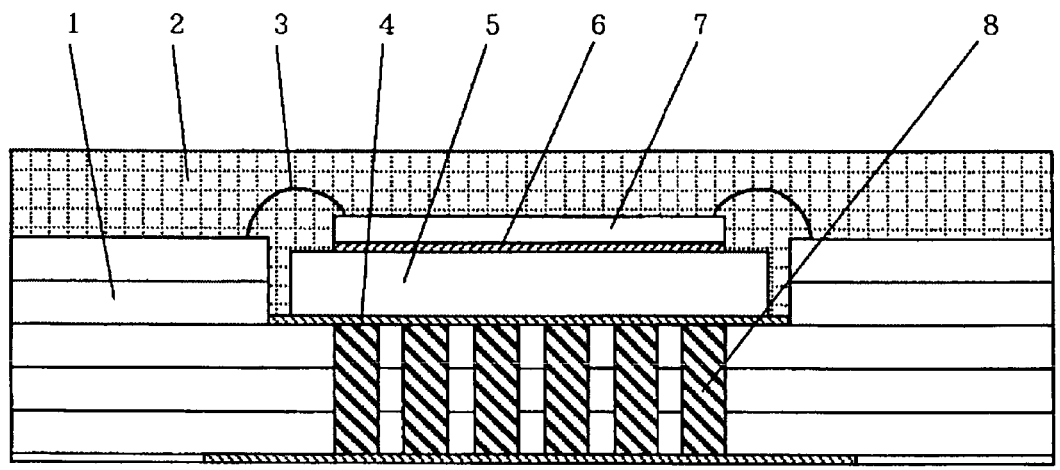
FIG. 1 is a sectional view showing a mounting structure of a conventional semiconductor heating element.
Figure 2:
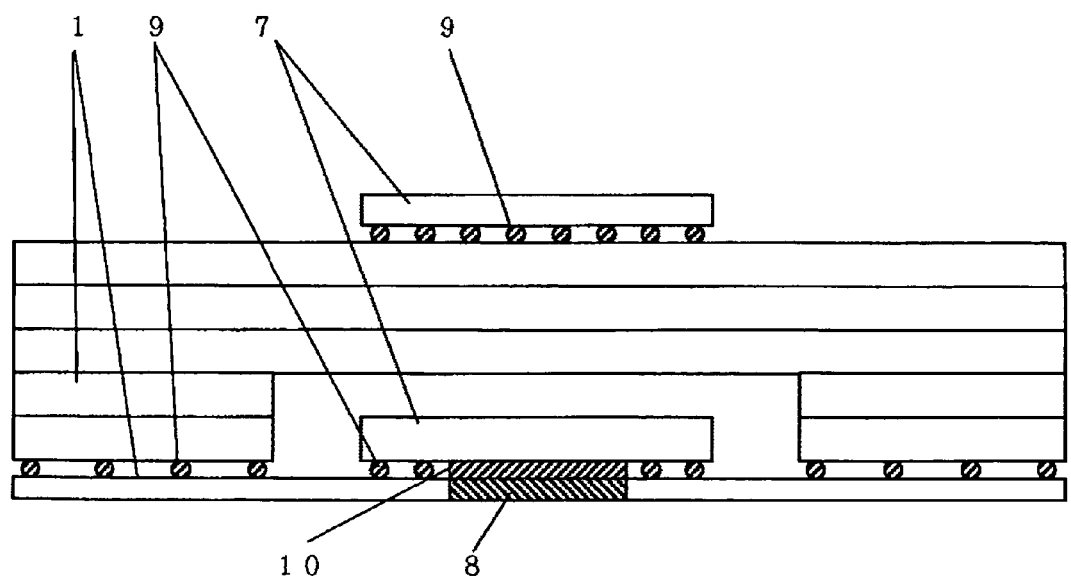
FIG. 2 is a sectional view showing a mounting structure of a conventional semiconductor heating element.
Figure 3:
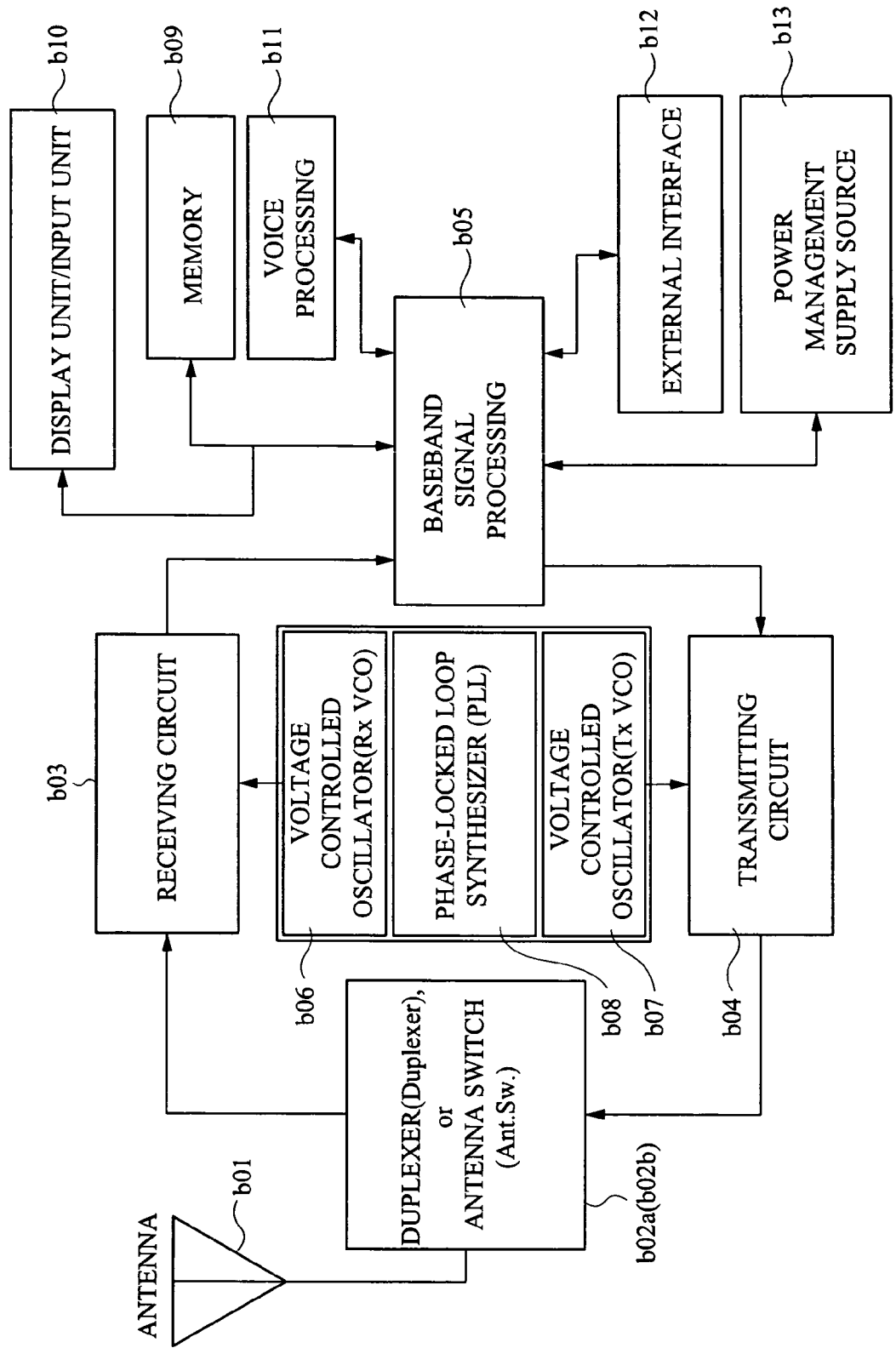
FIG. 3 is a block system diagram showing an outline of a signal processing circuit to be mounted on a mobile information terminal.

Further, similarly to the prior art as shown in FIG. 1, when the active region of the gallium arsenide substrate is connected to the upper side of the Figure, that is, facing upward, it is necessary to make the thickness of the second semiconductor element 702 as thin as possible in order to reduce heat resistance, thereby to suppress the rise of the element temperature. Such a process of making the thin film increases the number of processes and ends up causing the manufacturing cost of the semiconductor device to rise up, but since heat can be escaped directly to the combination heat dissipation and large area bump 10 through an emitter electrode and an emitter wiring from the heat generating region as facing downward, it is possible to omit the process of making the thin film.

Further, the first semiconductor element 701 is used, for example, for power amplification of the frequency bands and standards such as the GSM and a DCS (Digital Cellular System), and the second semiconductor element 702 is used, for example, for power amplification of the frequency bands and standards such as the W-CDMA, thereby it is almost impossible to use the radio communication functions of the plurality of frequency bands and standards by the same radio communication module totally and simultaneously, and therefore, granting that the first semiconductor element 701 and the second semiconductor element 702 are seen from a normal direction of the wiring substrate 1, even when the range occupied by each heat generating region is overlapped, the heat generation of the semiconductor elements 701 and 702 is not mutually overlapped, and therefore, a distinctively upward rising of the temperature can be avoided.

Figure 11:
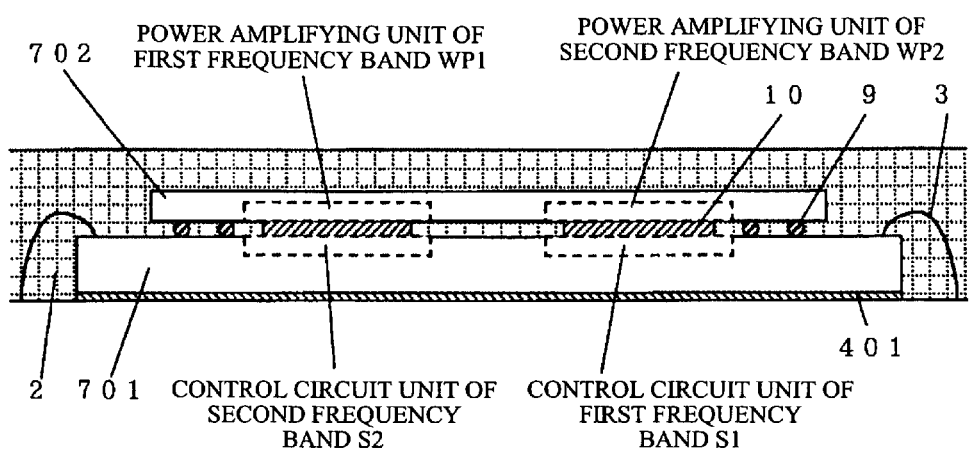
FIG. 11 is a sectional view showing one example in the case where the power amplifying unit is mounted on a control unit by flip-chip connection from among the power amps to be mounted on the mobile information terminal of the present invention.

On the other hand, even when the second semiconductor element 702 has, for example, a power amplifying unit only of the plurality of frequency bands and standards, and has the control circuit thereof formed on the first semiconductor element 701, the heat value of the control circuit is small as compared with the power amplifying unit, and therefore, by the mounting structure as shown in FIG. 5, the temperature rise of the second semiconductor element 702 can be suppressed. Further, similarly to the sectional view as shown in FIG. 11, by the layout of the wiring layer of the surface of the first semiconductor element 701, the control circuit of the power amplifying unit of the second frequency band within the first semiconductor element 701 is disposed so as to come to a position opposing to the power amplifying unit of the first frequency band within the second semiconductor element 702, so that, even if the heat generating region as the entire element of the semiconductor elements 701 and 702 is overlapped in range, when seeing on each frequency band and standard, the heat arising from the control circuit does not affect the power amplifying unit, and therefore, the temperature rise of the semiconductor element 702 can be effectively suppressed.

Second Embodiment

Another embodiment of the present invention will be described by using FIG. 12. The present embodiment is characterized in that a first semiconductor element 701 is flip-chip connected from among the mounting structures of the embodiment shown in FIGS. 4 to 11, and is mounted on a wiring substrate 1 by a first connecting bump 901, and upon thereof, a second semiconductor element 702 is laminated in a stacked state by a second connecting bump 902 and a combination heat dissipation and large area bump 10.

Figure 12:
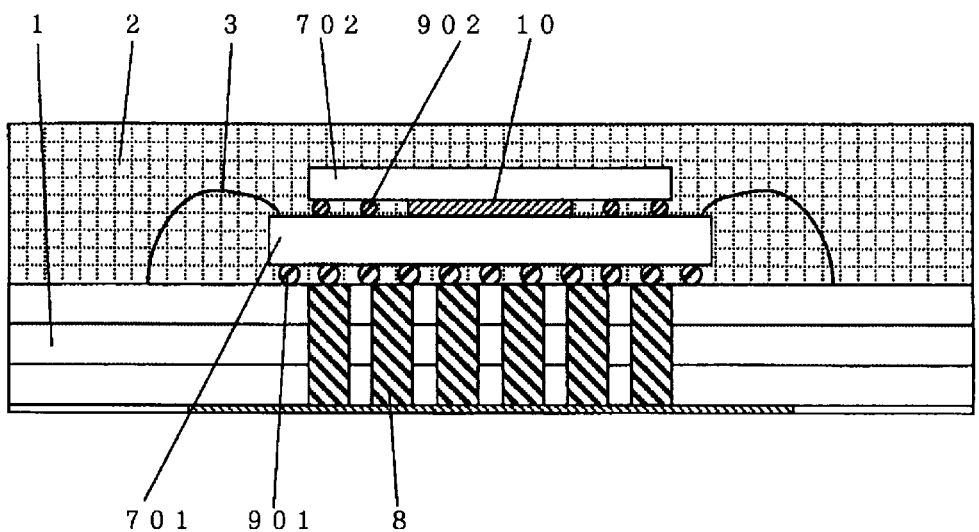
FIG. 12 is a sectional view showing another embodiment of the mounting structure of the power amplifier to be mounted on the mobile information terminal of the present invention.

In the present embodiment shown in FIG. 12, though there is a problem that heat resistance is increased between the first semiconductor element 701 and a wiring substrate 1 by flip-chip connecting the first semiconductor element 701, a heat generating region of the element that generates heat at different time is within an overlapped range seen from a normal line of the wiring substrate 1, the effect of the first semiconductor element 701 functioning as a heat diffusion plate for the second semiconductor element 702 is the same.

In the present embodiment, at the time of mounting, a wiring layer that connects the second semiconductor element 702 and the wiring substrate 1 is formed on the rear surface of the first semiconductor element 701 facing upward, and is connected to the wiring substrate 1 through a bonding wire 3. Further, an active region of the first semiconductor element 701 and the wiring layer for connection of the second semiconductor element which is formed on the rear surface are characterized by being formed on the different surfaces of the same semiconductor substrate.

Third Embodiment

Another embodiment of the present invention will be described by using FIG. 13. The present embodiment is characterized by forming a through-hole electrode 13 in a first semiconductor element 701 from among the mounting structures of the embodiment shown in FIG. 12, and performing all the exchanges of signals between wiring substrate 1 and the first semiconductor element 701 and a second semiconductor element 702 through a first signal connecting bump 901, thereby making wire bonding unnecessary.

Figure 13:
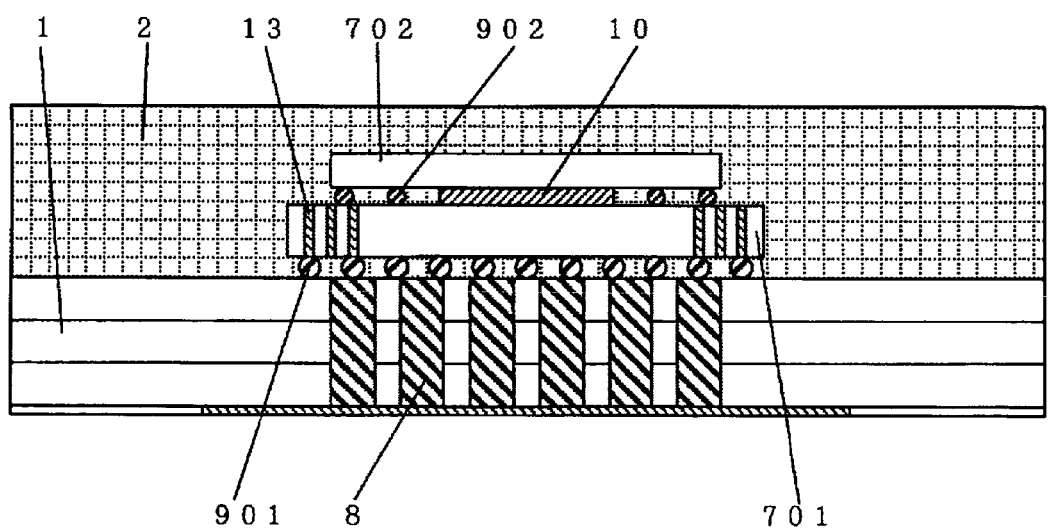
FIG. 13 is a sectional view showing another embodiment of the mounting structure of the power amplifier to be mounted on the mobile information terminal of the present invention.

While the embodiments of the present invention shown in FIGS. 12 and 13 show a structure in which the first semiconductor elements 701 to be flip-chip connected are all connected to the wiring substrate 1 by the first signal connecting bump 901, if the bump 901 is uniform in height at the product mounting time so that the first semiconductor element 701 and the wiring substrate 1 are surely connected, there is no problem even if the area thereof is different. Of course, it does not matter even if heat resistance of the first semiconductor element 701 is reduced by using a bump similarly to a combination heat dissipation and large area bump 10 within a range not adversely affected circuit-wise.

Fourth Embodiment

While embodiments of the present invention shown in FIGS. 4 to 13 show the mounting structure of the case where a power amp only is taken as a target from among high frequency radio communication circuits mounted on mobile information terminals, since the semiconductor device mounted on the mobile information terminal shows a tendency to increase, the semiconductor device (module) configuring a radio frequency unit (RF unit) and a baseband unit develops a tendency to be consolidated and put together into the small number of modules. FIGS. 14 to 28 show block system diagrams of the high frequency radio communication circuit devices including the power amp, which is a target of the present invention. In each of the Figures, a portion surrounded by a broken line is consolidated as one module or consolidated as one module after being sub-modularized, and is often used as a so-called "system in package" (SIP), which constitutes a large system in either case. The embodiments in the sectional views of FIGS. 29 to 44 show mounting structures of these SIPs.

Figure 14:
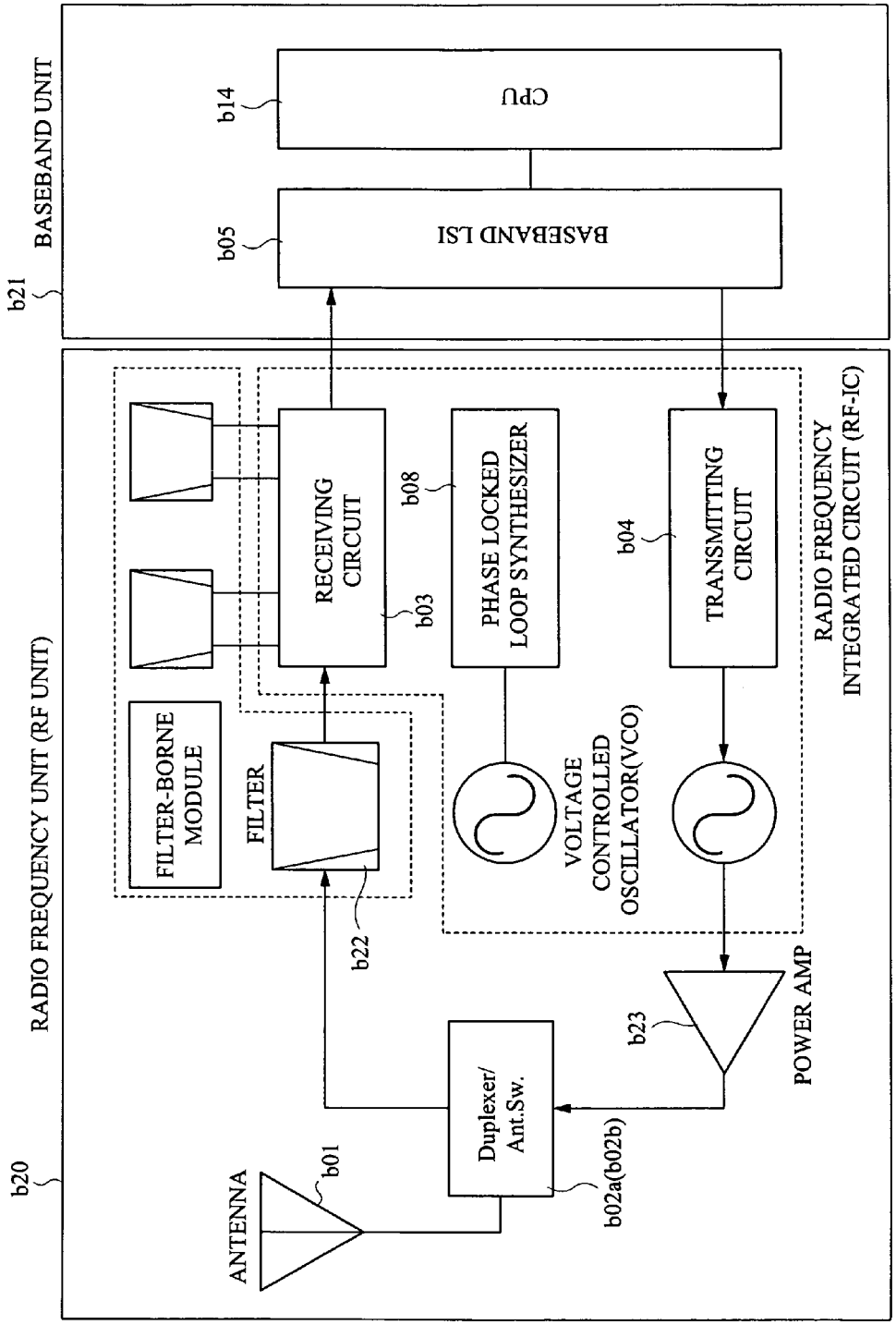
FIG. 14 is a block system diagram showing the outline of a signal processing circuit to be mounted on the mobile information terminal of the present invention.

FIG. 14 shows a circuit structure in which the radio frequency unit (RF unit) is consolidated to five modules of the antenna, branching filter or antenna switch, filter-borne module, RF-IC (radio frequency integrated circuit) and power amp or a sub-module.

Figure 15:
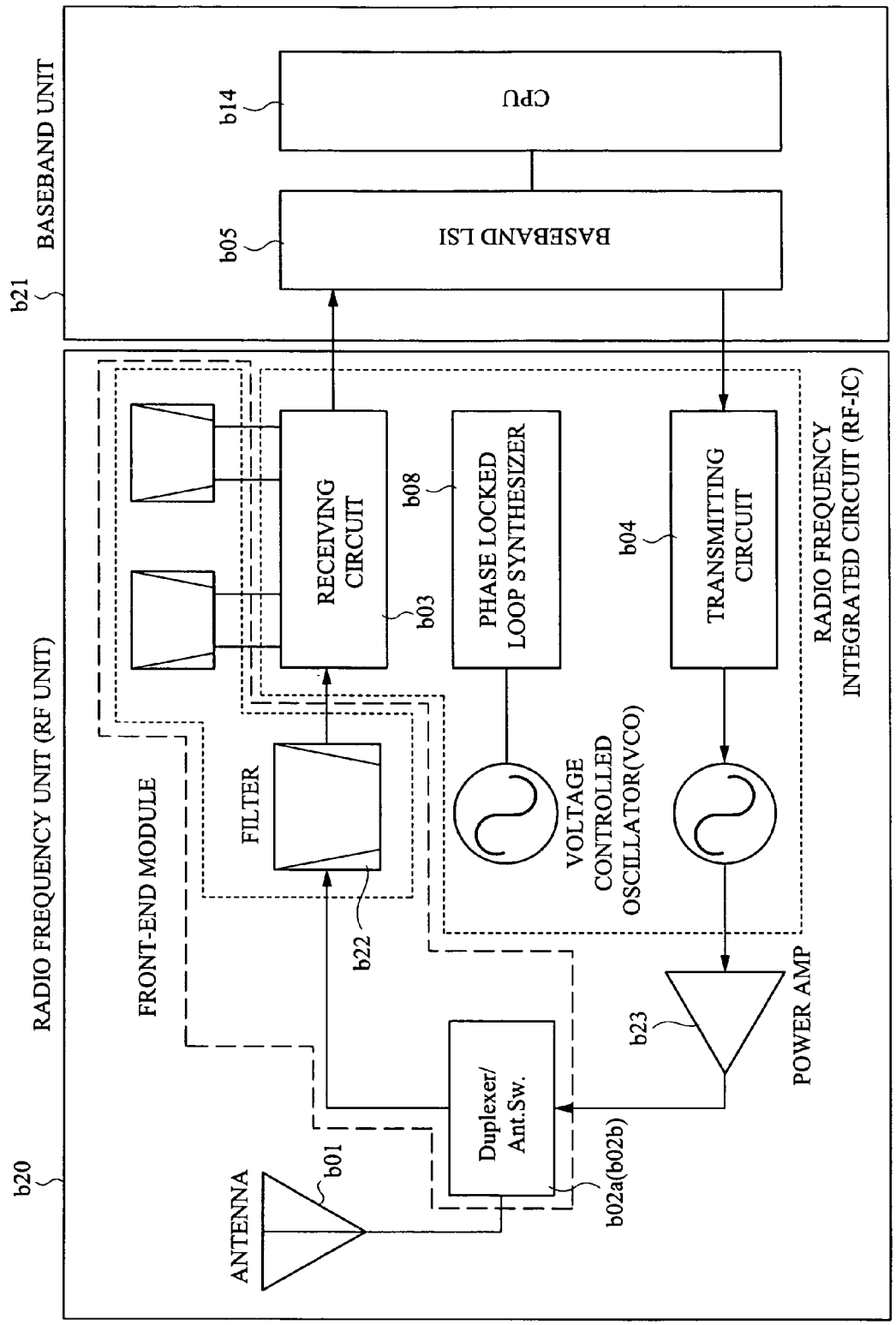
FIG. 15 is a block system diagram showing the outline of a signal processing circuit to be mounted on the mobile information terminal of the present invention.

FIG. 15 shows a circuit structure of the case where the filter-borne (sub) module and branching filter or antenna switch are consolidated to a front-end module, and the RF unit is constituted by the antenna, front-end module, RF-IC, and power amp.

Figure 16:
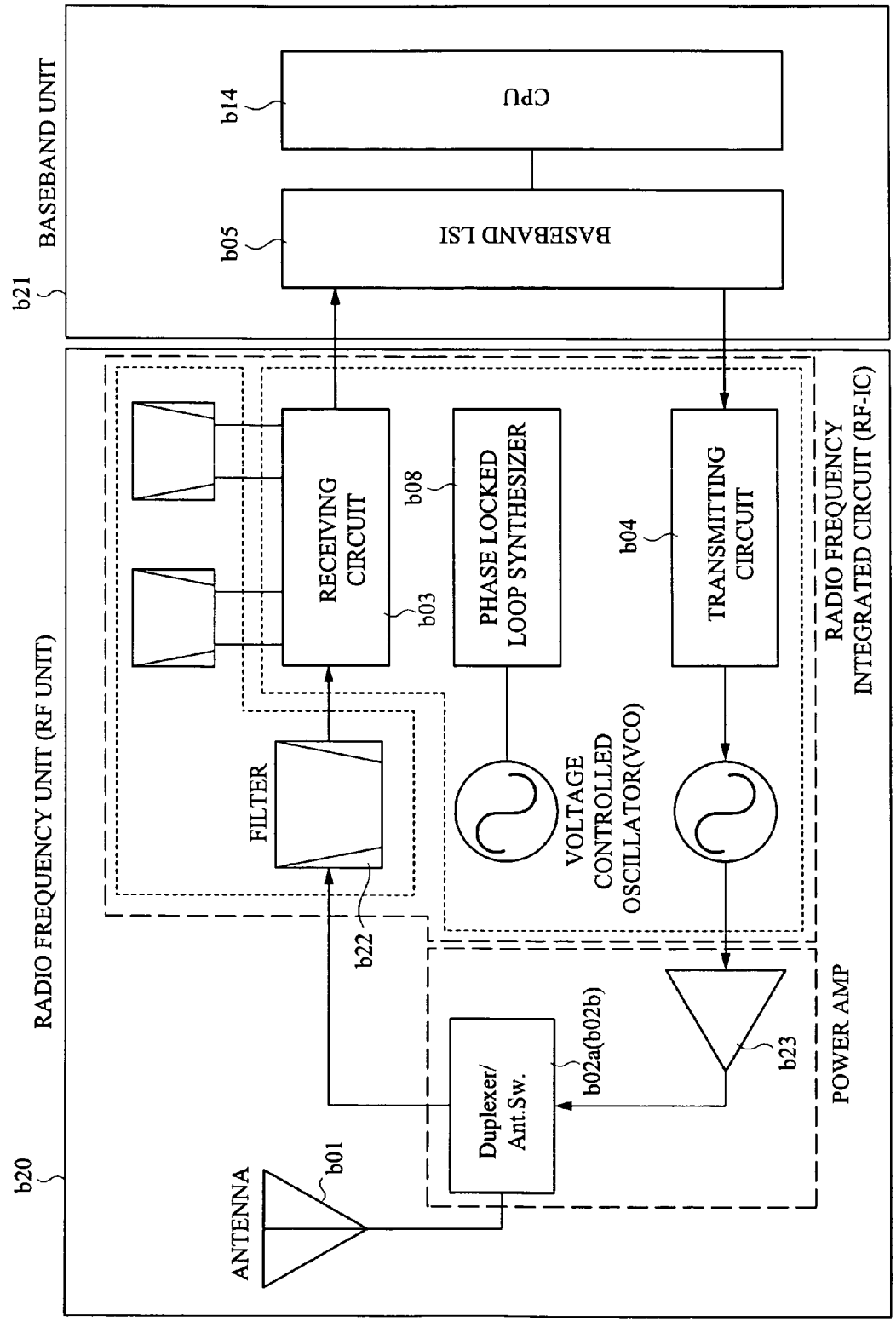
FIG. 16 is a block system diagram showing the outline of a signal processing circuit to be mounted on the mobile information terminal of the present invention.

FIG. 16 shows a case where the power amp and branching filter or antenna switch are consolidated as a power amp module, and the RF-IC and filter-borne (sub) module is consolidated to a RF-IC module.

Figure 17:
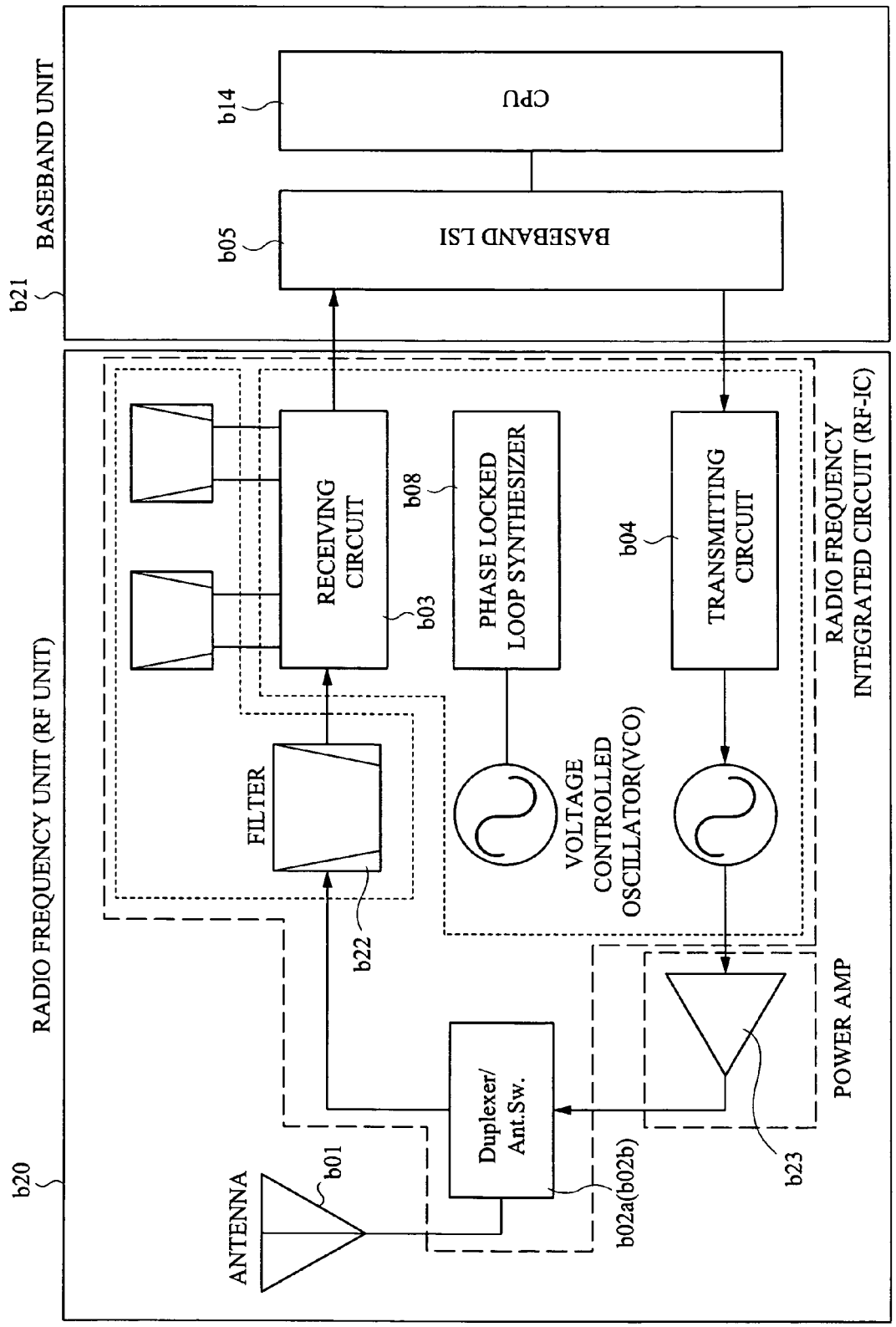
FIG. 17 is a block system diagram showing the outline of a signal processing circuit to be mounted on the mobile information terminal of the present invention.

FIG. 17 shows a case where the front-end module and RF-IC of FIG. 15 are consolidated to one module, and the power amp is independent.

Figure 18:
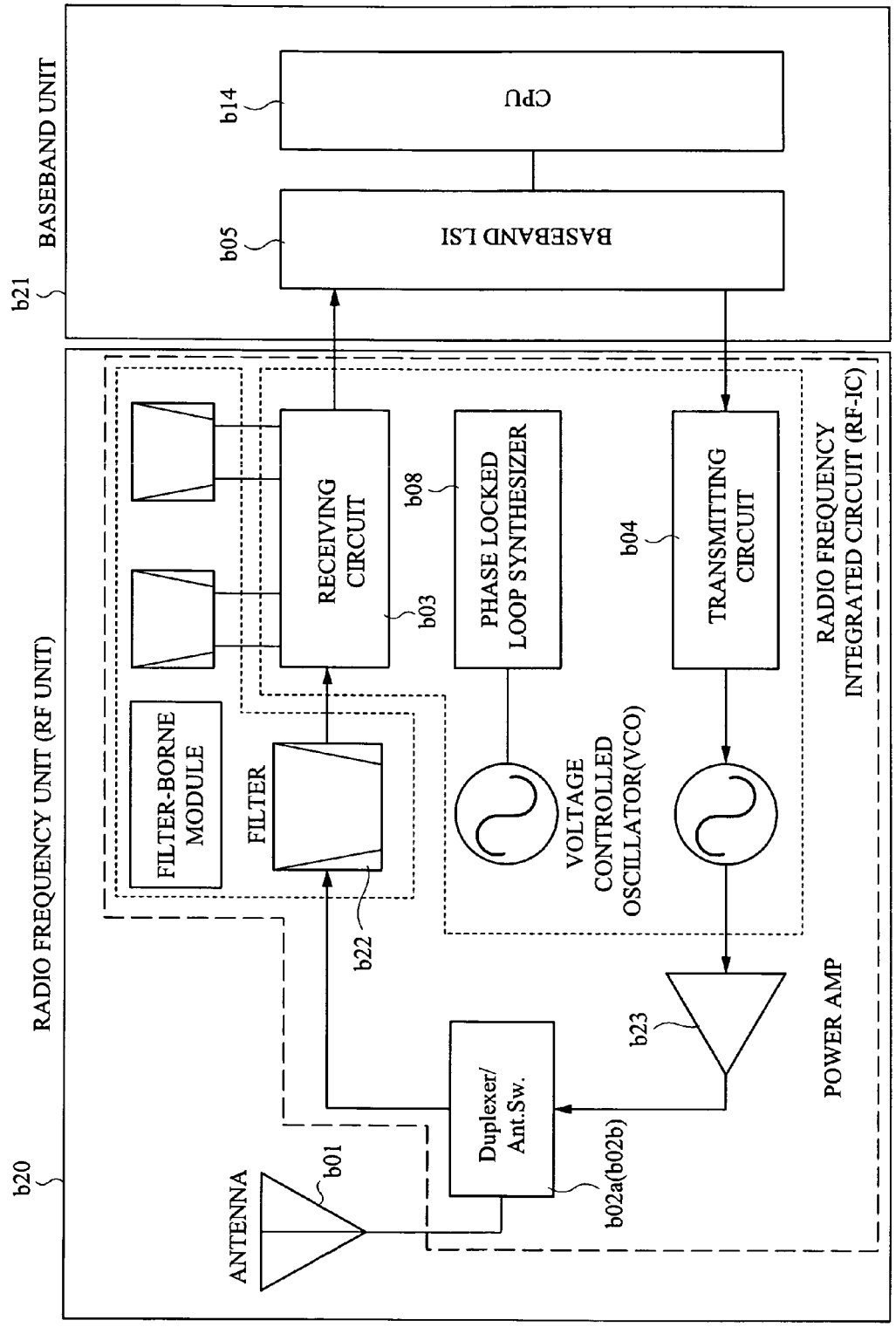
FIG. 18 is a block system diagram showing the outline of a signal processing circuit to be mounted on the mobile information terminal of the present invention.

FIG. 18 shows a case where all the RF units other than the antenna constitute one consolidated module.

Figure 19:
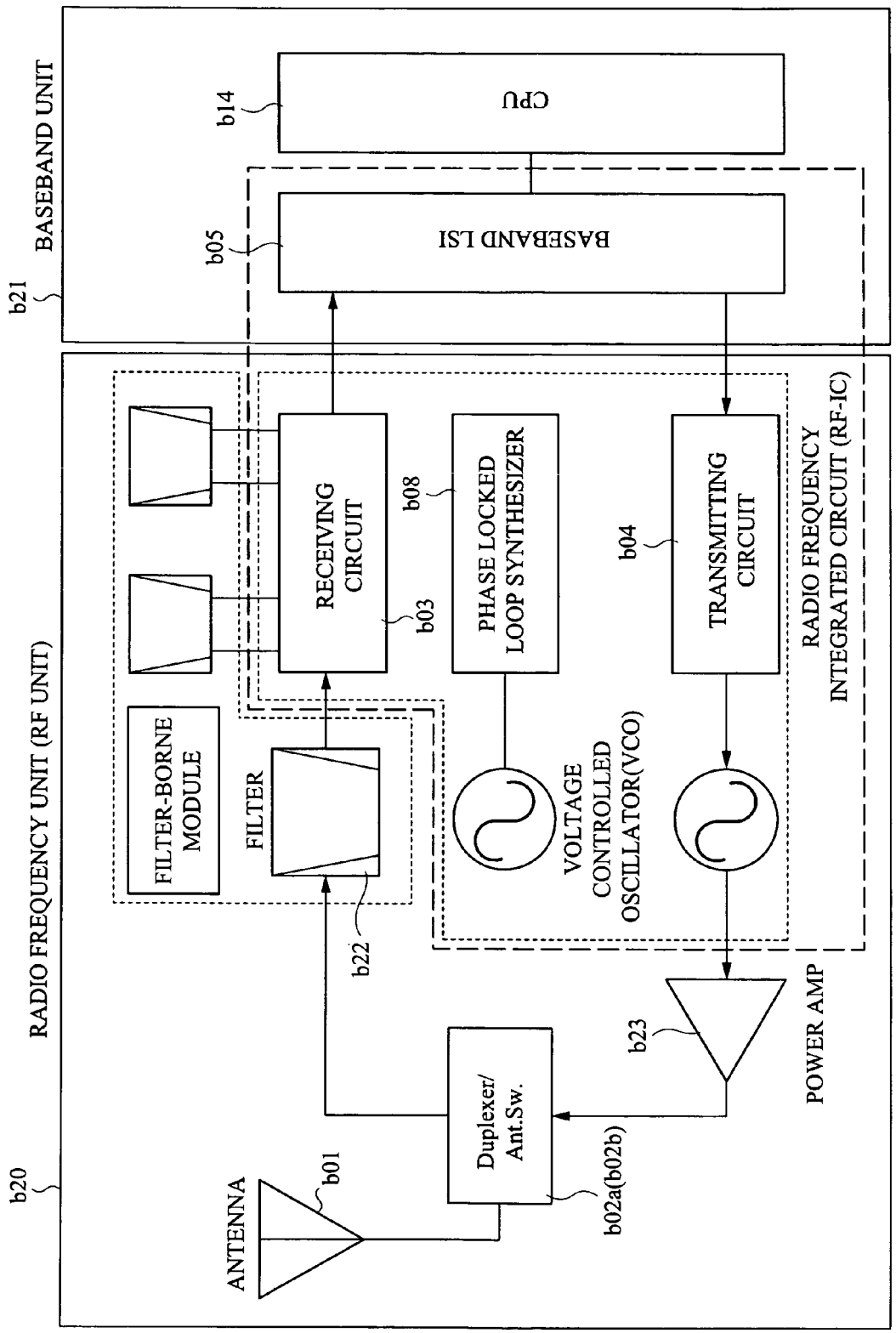
FIG. 19 is a block system diagram showing the outline of a signal processing circuit to be mounted on the mobile information terminal of the present invention.

FIG. 19 shows a case where the RF-IC and the baseband LSI are consolidated, and the filter-borne module of the RF unit, branching filter or antenna switch, and power amp are constituted as an independent module.

Figure 20:
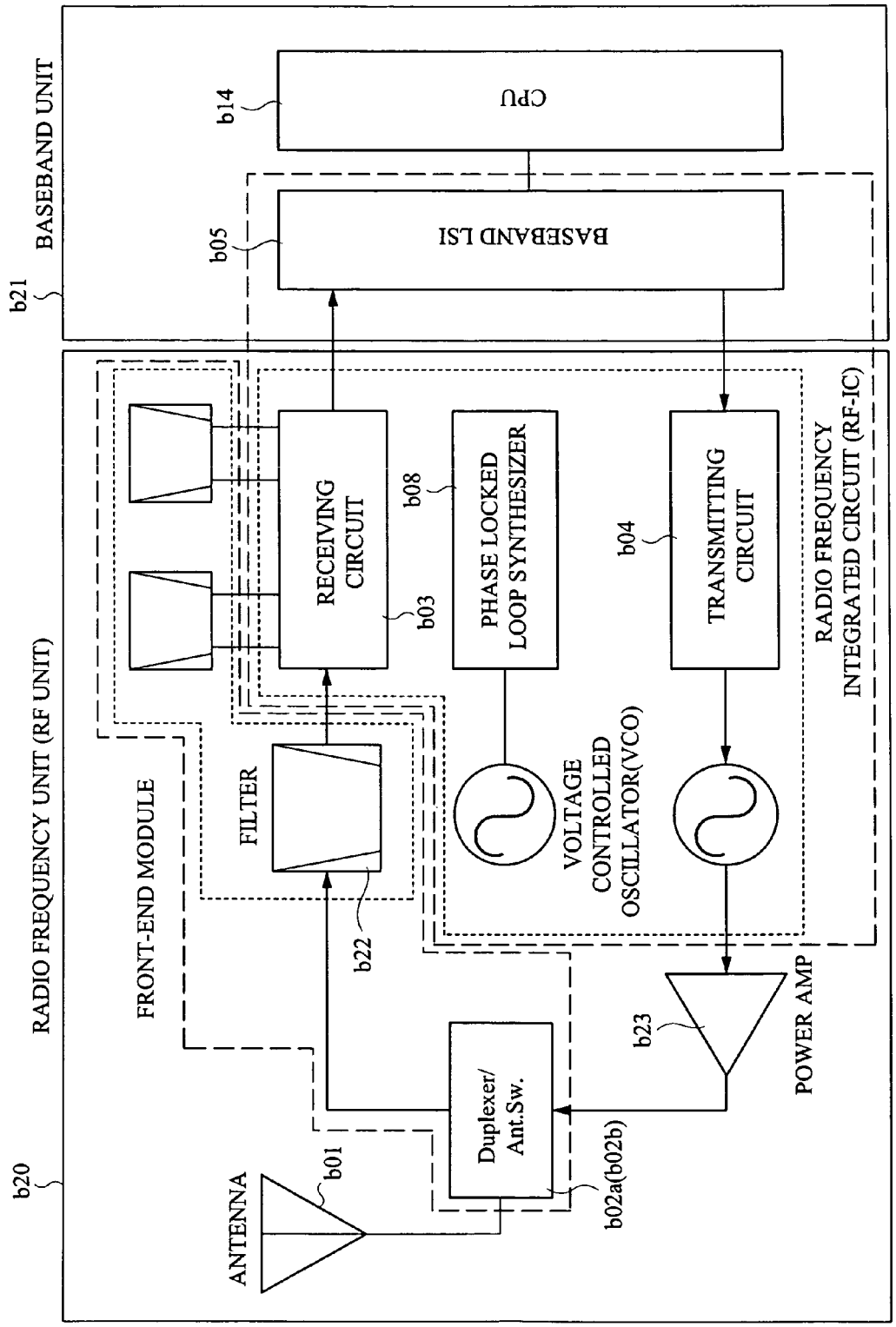
FIG. 20 is a block system diagram showing the outline of a signal processing circuit to be mounted on the mobile information terminal of the present invention.

FIG. 20 shows a case where the RF-IC and baseband LSI are consolidated, and moreover, the branching filter or antenna switch and filter-borne (sub) module constitute a front-end module.

Figure 21:
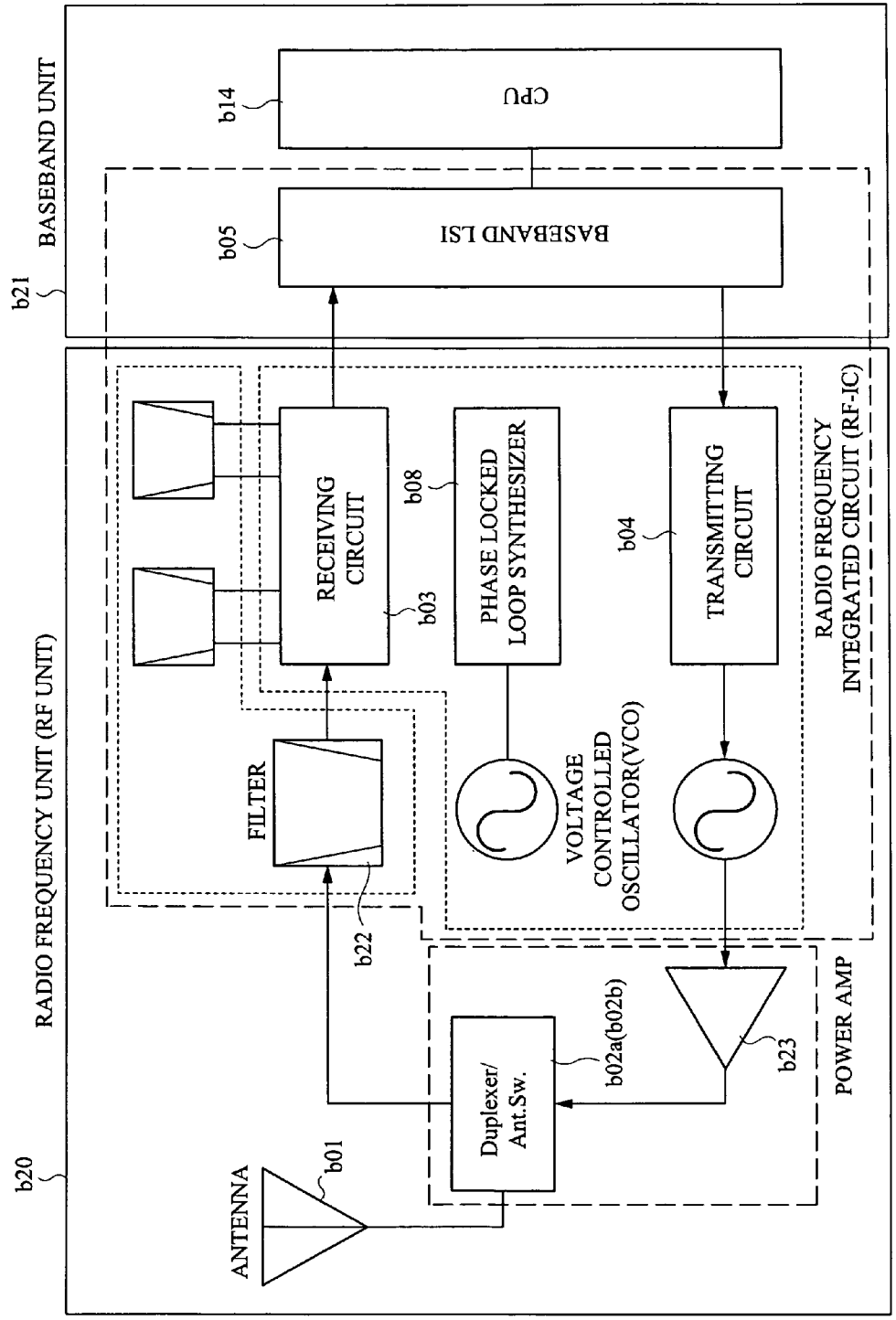
FIG. 21 is a block system diagram showing the outline of a signal processing circuit to be mounted on the mobile information terminal of the present invention.

FIG. 21 shows a case where the filter-borne (sub) module and RF-IC and baseband LSI are consolidated to one module, and the branching filter or antenna switch and power amp are consolidated to a power amp module.

Figure 22:
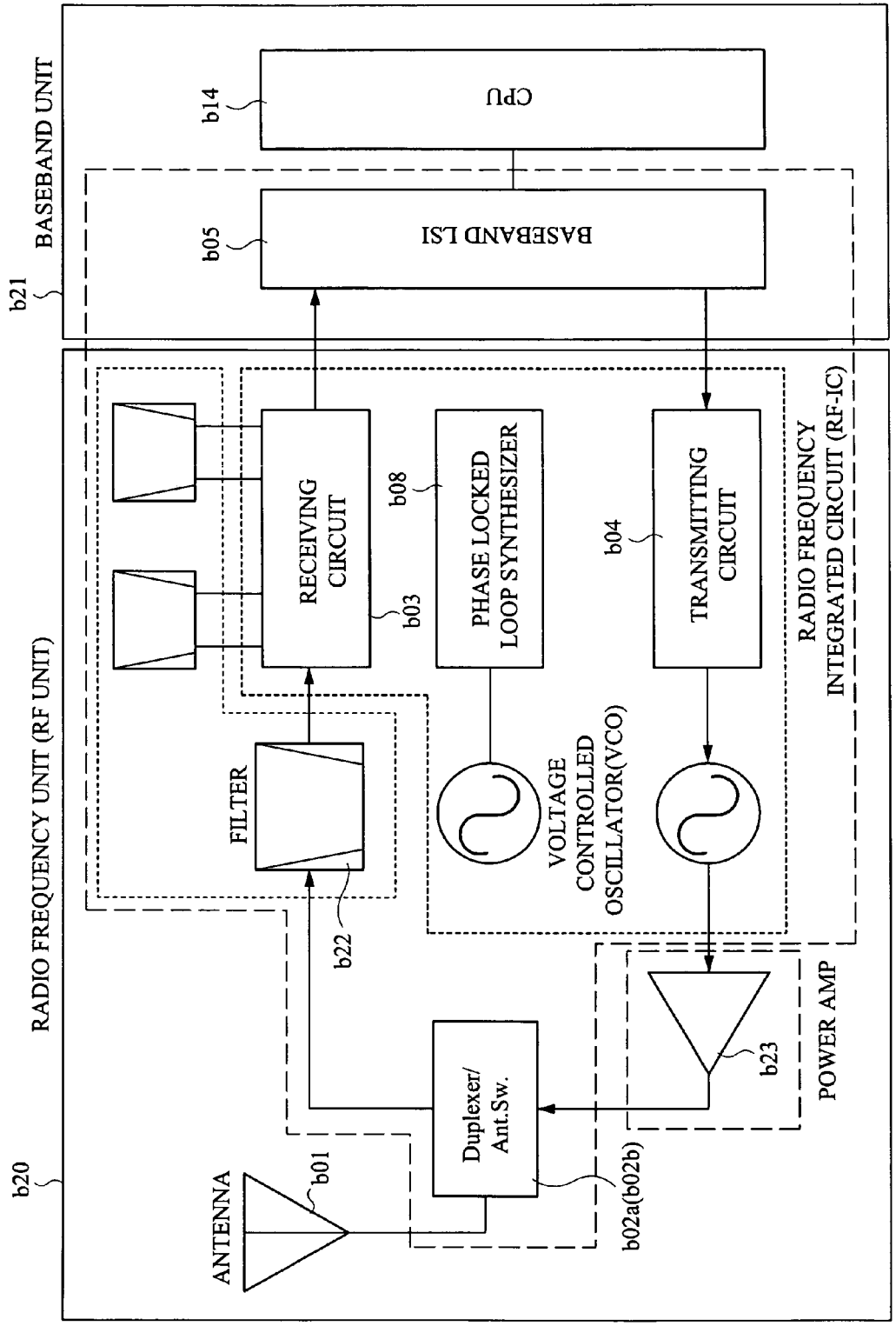
FIG. 22 is a block system diagram showing the outline of a signal processing circuit to be mounted on the mobile information terminal of the present invention.

FIG. 22 shows a case where the front-end module, RF-IC, and baseband LSI are consolidated, and the power amp constitutes an independent module.

Figure 23:
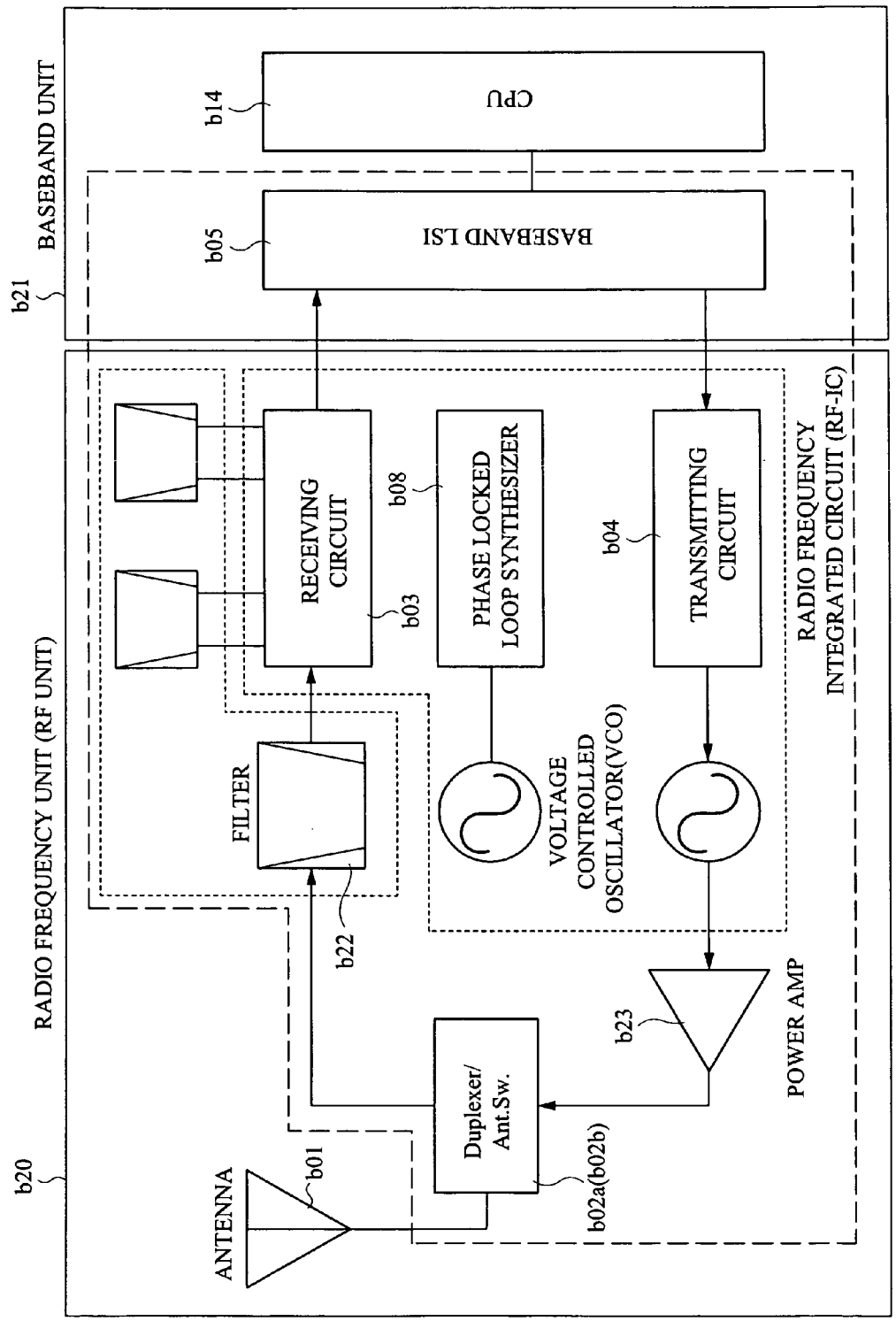
FIG. 23 is a block system diagram showing the outline of a signal processing circuit to be mounted on the mobile information terminal of the present invention.

FIG. 23 shows a case where the RF unit other than the antenna and baseband LSI constitutes one consolidated module.

Figure 24:
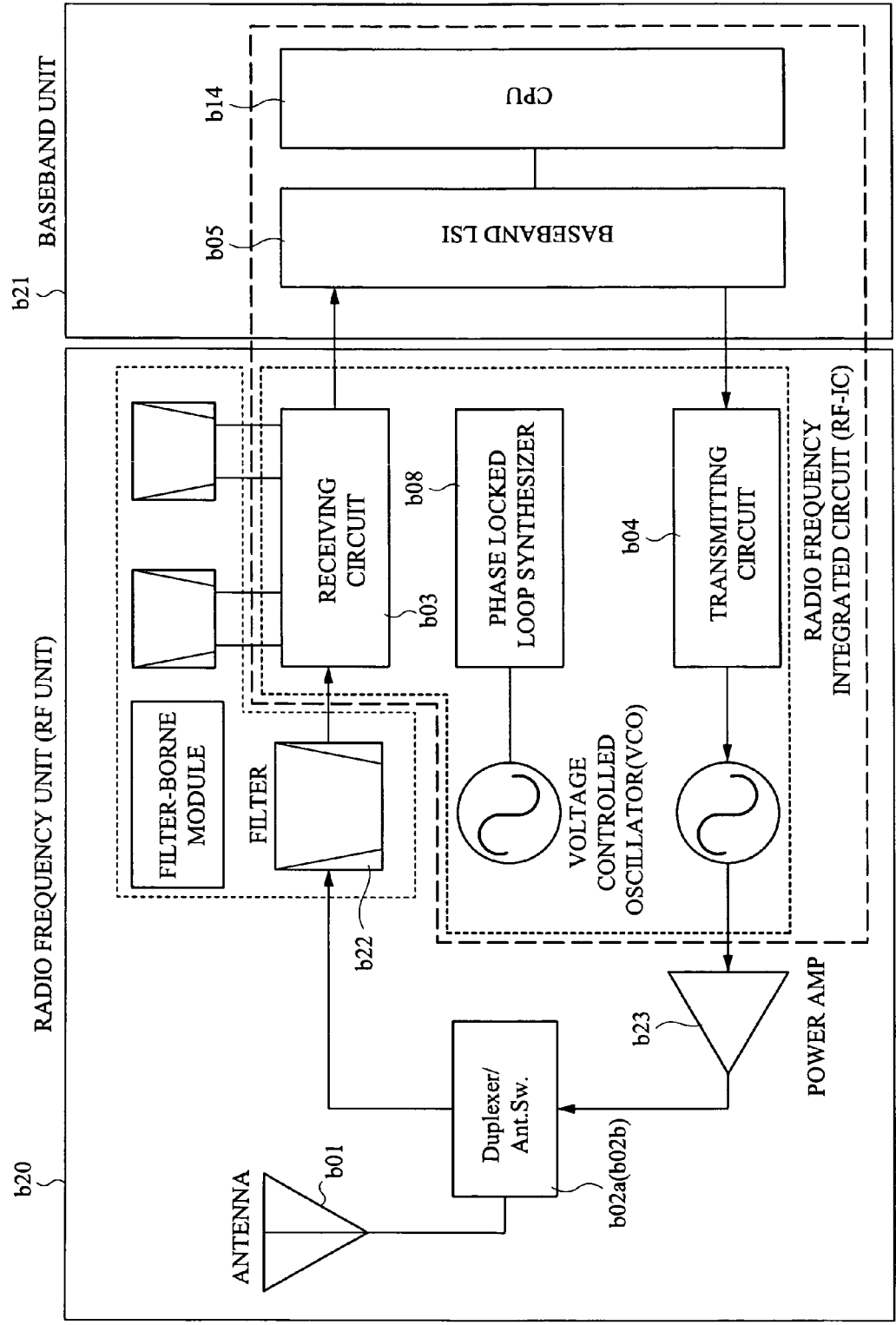
FIG. 24 is a block system diagram showing the outline of a signal processing circuit to be mounted on the mobile information terminal of the present invention.

FIG. 24 shows a case where the filter-borne module, branching filter or antenna switch and power amp exist as an independent module, respectively.

Figure 25:
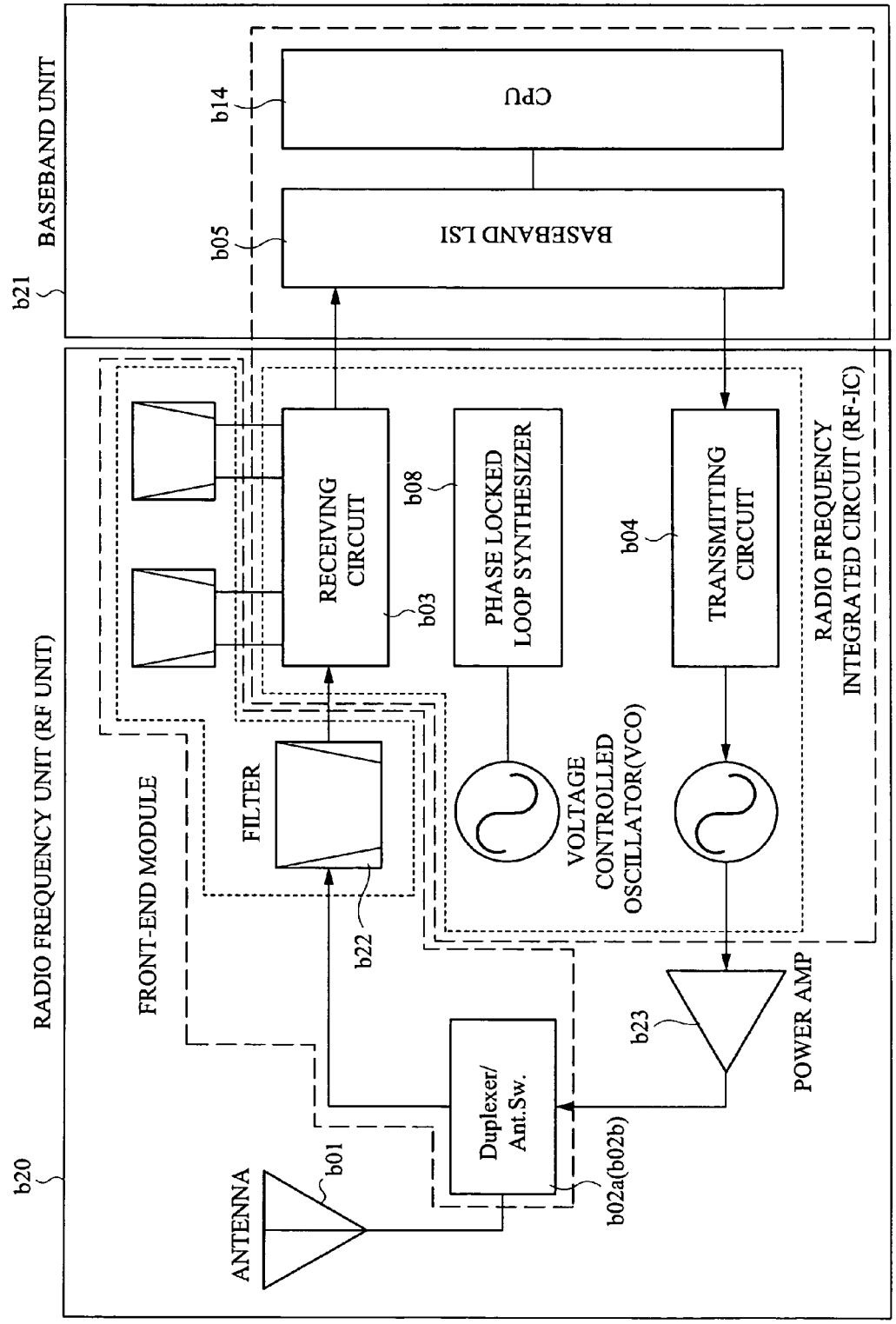
FIG. 25 is a block system diagram showing the outline of a signal processing circuit to be mounted on the mobile information terminal of the present invention.

FIG. 25 shows a case where the RF-IC, baseband LSI, and CPU are consolidated to one module, and the filter-borne (sub) module and branching filter or antenna switch are consolidated to a front-end module, and the power amp exists as an independent module.

Figure 26:
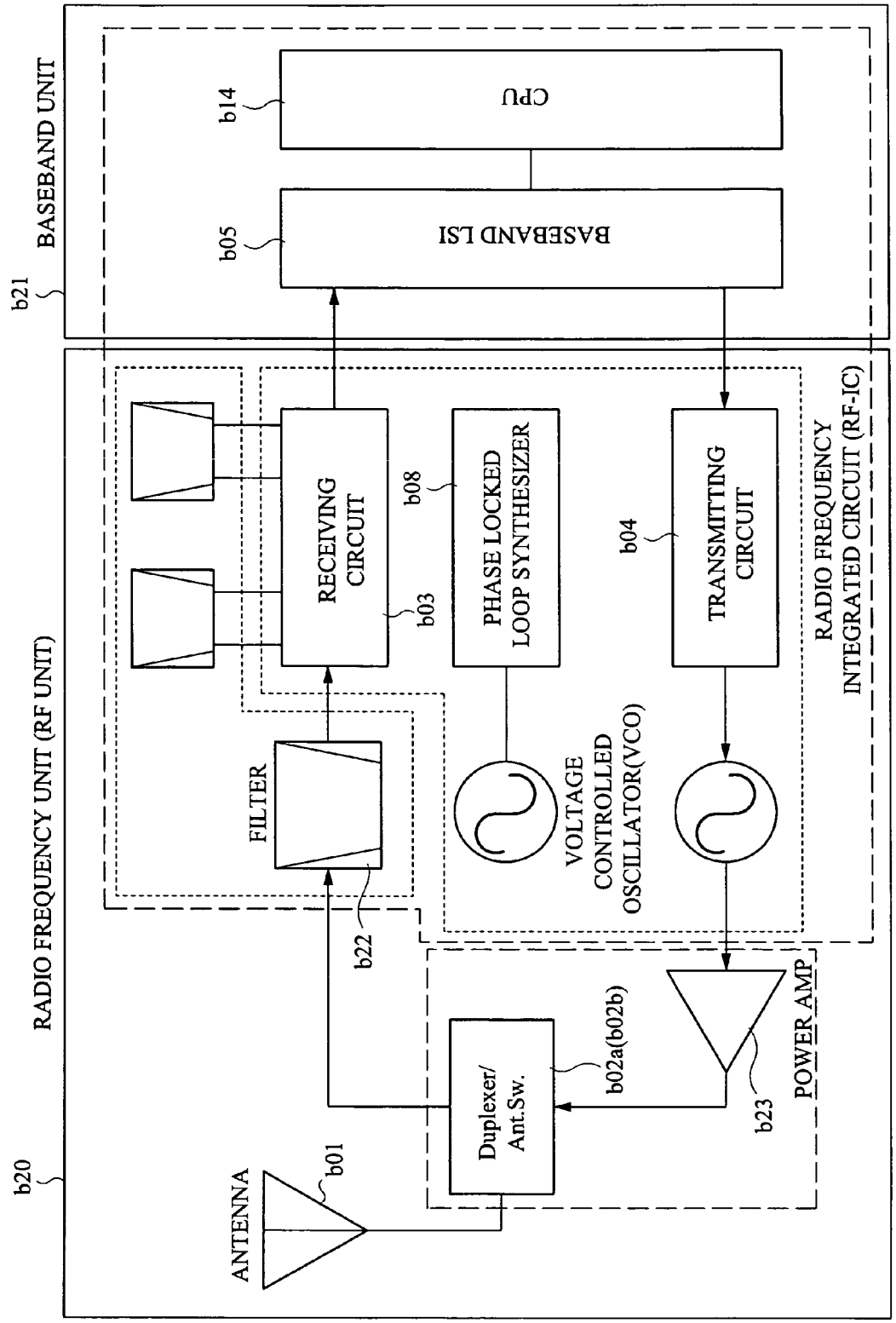
FIG. 26 is a block system diagram showing the outline of a signal processing circuit to be mounted on the mobile information terminal of the present invention.

FIG. 26 shows a case where the RF-IC, baseband LSI, CPU, and filter-borne (sub) module are consolidated to one module, and the branching filter or antenna switch and power amp are consolidated to another one module.

Figure 27:
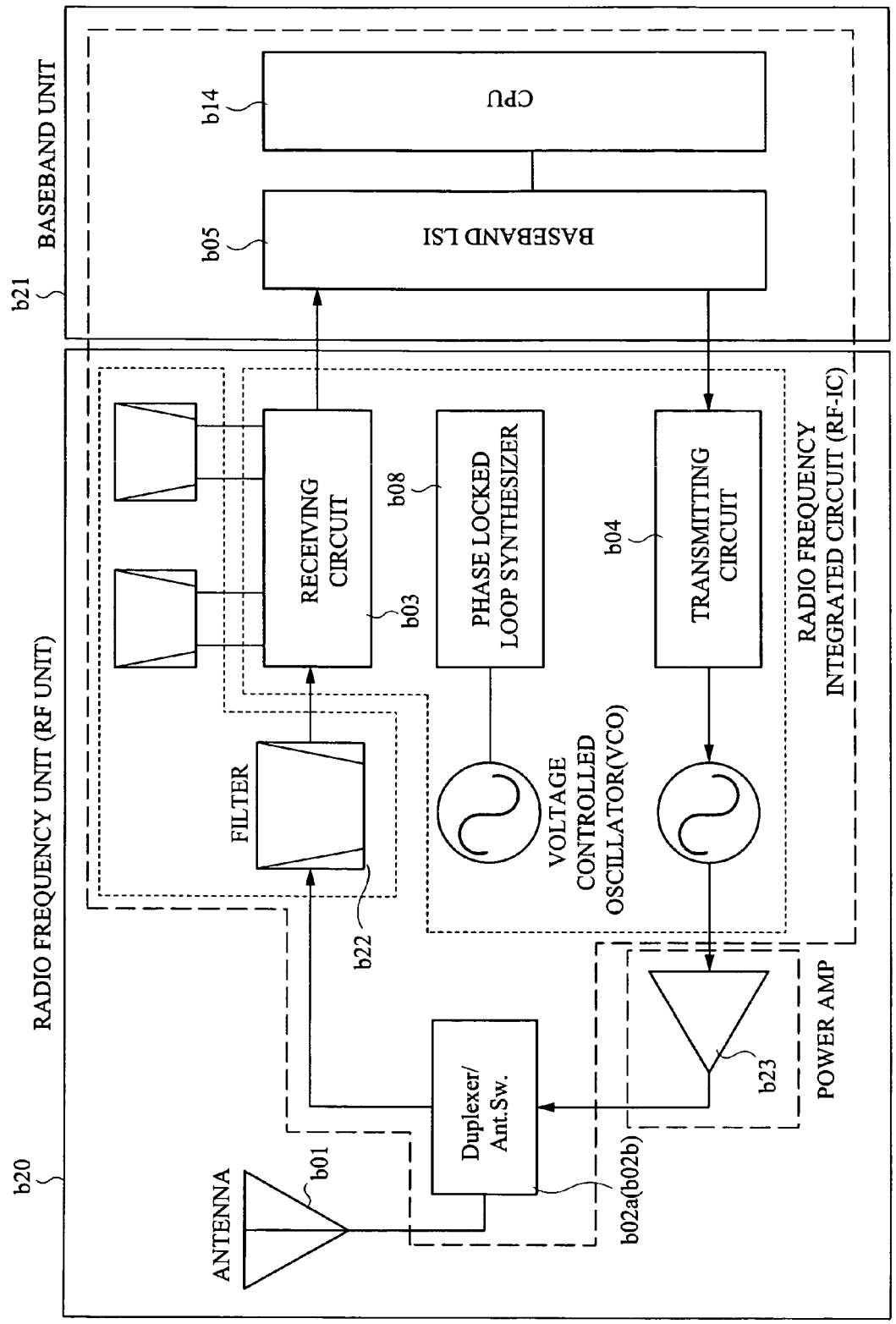
FIG. 27 is a block system diagram showing the outline of a signal processing circuit to be mounted on the mobile information terminal of the present invention.

FIG. 27 shows a case where the RF-IC, baseband LSI, CPU, and front-end module are consolidated to one module, and the power amp exists as an independent module.

Figure 28:
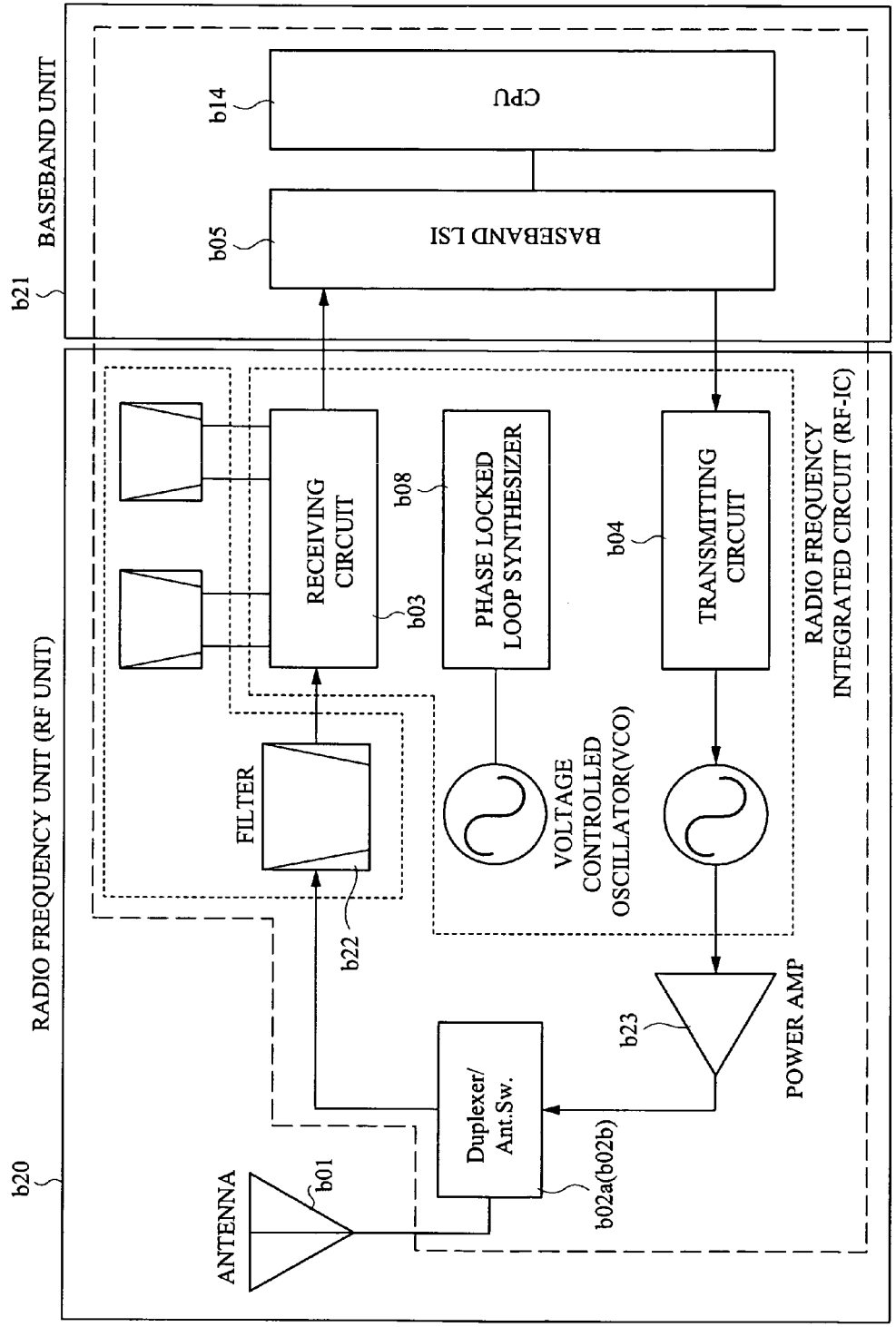
FIG. 28 is a block system diagram showing the outline of a signal processing circuit to be mounted on the mobile information terminal of the present invention.

FIG. 28 shows a case where all the RF units other than antenna, and baseband unit are consolidated to one module.

When referring to the block system diagrams of FIG. 4 and FIGS. 15 to 28, it is highly likely that combinations other than the above described exist, and those shown are only representative examples. These block system diagrams can be basically classified into block system diagrams of FIGS. 4, 14, 16, 17, 19, 20, 21, 22, 24, 25, 26, and 27 in which the power amp or the power amp and branching filter or antenna switch exist as an independent module, and the block system diagrams of FIGS. 18, 23, and 28 in which the power amp is consolidated with the RF-IC into one module. In FIG. 4 and FIGS. 15 to 28, though no detailed part structures are shown, but as a major division regardless of the presence or absence of the parts, the high frequency radio communication circuits having the structure similarly to each Figure are all included in each embodiment of the present invention. Further, even when there exist few, if any, of differences in the circuit structure and the system structure, there exist only two cases where the RF-IC and power amp constitutes an independent module or they are consolidated to the same module, and therefore, the system structures which are not illustrated are also all included in the embodiments of the present invention.

The mounting structure of a consolidated module of the power amp or power amp and branching filter or antenna switch of the system structures shown in FIGS. 4, 14, 16, 17, 19, 20, 21, 22, 24, 25, 26, and 27 can realize high functionalization and low heat resistance (inhibition of the temperature rise) by each embodiment of the present invention represented by FIG. 5 or FIG. 12 or FIG. 13. Even when the branching filter or antenna switch is consolidated to a module, for example, a diode switch and a gallium arsenide HEMT (High Electron Mobility Transistor) switch are formed in the first semiconductor element 701 or the second semiconductor element 702, so that a multi-layer mounting structure excellent in heat dissipation properties can be realized by size saving for the plurality of frequency bands and standards.

Incidentally, in the mounting structure shown in FIG. 5 or FIG. 12 or FIG. 13, though the structure building up two semiconductor elements in a stacked state is shown, if the structure is such that a plurality of elements that mainly generate heat at different times and areas are laminated in a stacked state, and another semiconductor element located between the semiconductor element of the lowest layer or the wiring substrate and a heating element which does not generate heat at that moment functions as a heat diffusion plate of the heating element, then, even when the semiconductor element is build up three or more than three layers, the same effect can be achieved.

Fifth Embodiment

Another embodiment of the present invention will be described by using FIG. 29 and FIGS. 18, 23, and 28. Different from the first to fourth embodiments, the present embodiment is characterized in that at least the RF-IC and power amp are consolidated to one module so as to constitute a SIP module.

Figure 29:
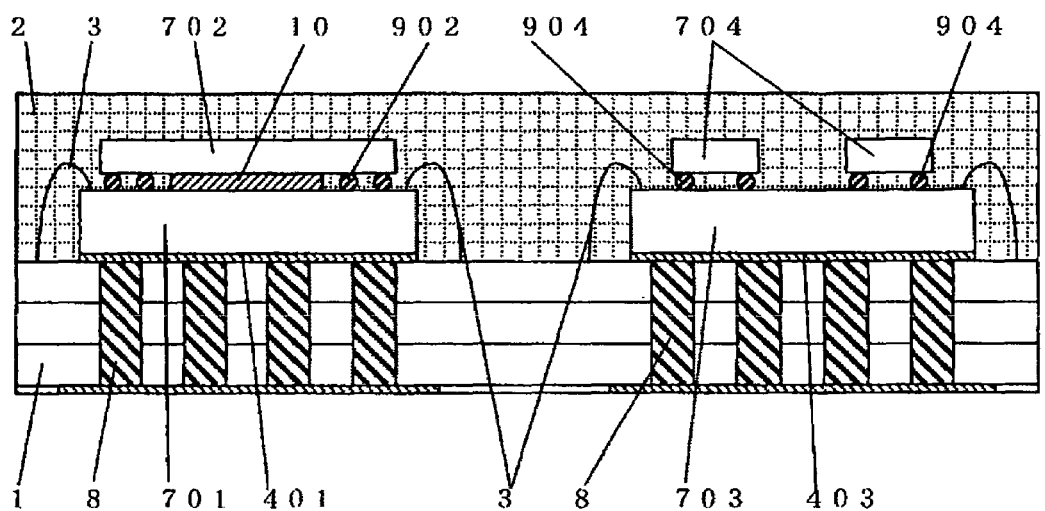
FIG. 29 is a sectional view showing another embodiment of the mounting structure of the power amplifier to be mounted on the mobile information terminal of the present invention.
Figure 30:
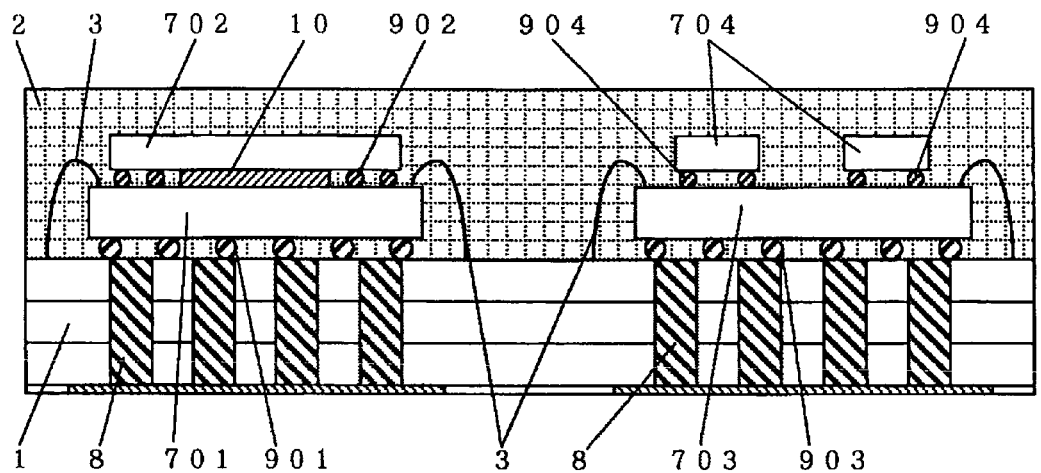
FIG. 30 is a sectional view showing another embodiment of the mounting structure of the power amplifier to be mounted on the mobile information terminal of the present invention.
Figure 31:
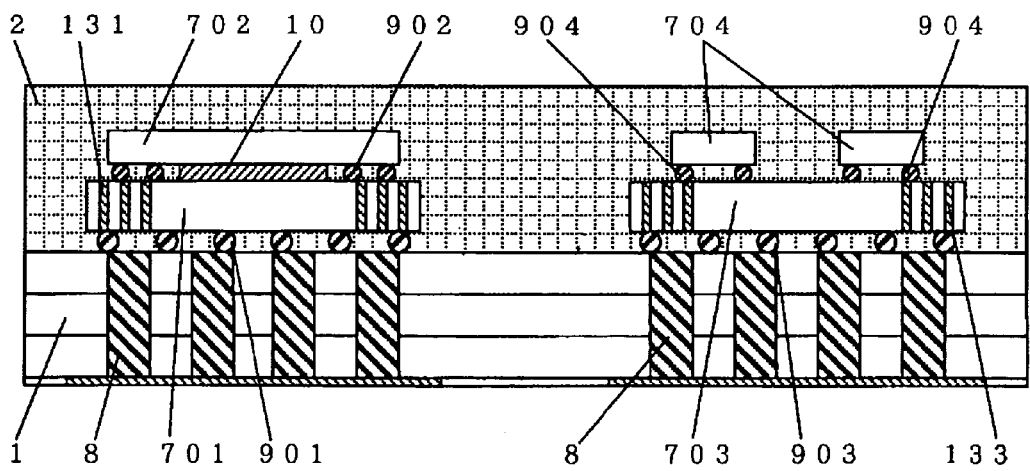
FIG. 31 is a sectional view showing another embodiment of the mounting structure of the power amplifier to be mounted on the mobile information terminal of the present invention.

In the present embodiment shown in FIG. 29, the first semiconductor element 701 and the second semiconductor element 702 constituting the power amp (sub) module are laminated on a wiring substrate 1 in a stacked state within the SIP module, and a sub-module is constituted in which the RF-IC (or the RF-IC and the baseband LSI or the RF-IC, baseband LSI, and CPU) are collectively formed on a SOI substrate and the like. The RF-IC sub-module which is a third semiconductor element 703 is mounted on the wiring substrate 1 by a face-up system, and a fourth semiconductor element 704 is flip-chip mounted on the third semiconductor element 703 via a fourth signal connecting bump 904.

In the present embodiment, the first semiconductor element 701 and the third semiconductor element 703, and the second semiconductor element 702 and the fourth semiconductor element 704 can be mounted on the wiring substrate by the same process, respectively, and therefore, the manufacturing process can be simplified, and with respect to the second semiconductor element 702 which includes a power amplifying unit of the power amp, the first semiconductor element 701 functions as a heat diffusion plate for the second semiconductor element 702.

Sixth Embodiment

Another embodiment of the present invention will be described by using FIG. 30, and FIGS. 18, 23, and 28. The present embodiment is common to the fifth embodiment up to the point where a wire bonding is used for the signal connection between the second semiconductor element 702 and the fourth semiconductor element 704. A point of difference lies in that the first semiconductor element 701 and the third semiconductor element 703 are connected to a wiring substrate 1 via a first signal connecting bump 401 and a third signal connecting bump 403, respectively.

The mounting structure of the sixth embodiment has a problem that, as compared to the fifth embodiment, the number of processes is slightly increased and the number of parts is increased. However, a first semiconductor element 701 and a third semiconductor element 703, and a second semiconductor element 702 and a fourth semiconductor element 704 can be mounted on the wiring substrate 1 by the same process, respectively, and therefore, the manufacturing process can be simplified, and with respect to the second semiconductor element 702 which includes a power amplifying unit of the power amp, the first semiconductor element 701 functions as a heat diffusion plate for the second semiconductor element 702, similarly to the fifth embodiment.

Seventh Embodiment

Another embodiment of the present invention will be described by using FIG. 31 and FIGS. 18, 23, and 28. The present embodiment has approximately the same structure as the embodiment shown in FIG. 30, and is characterized in that a through-hole electrodes 131 and 133 are formed in a first semiconductor element 701 and a third semiconductor element 703, and the signal connections between a wiring substrate 1 and each semiconductor element are all connected via a first signal connecting bump 901 or a third signal connecting bump 903. Although the formation of the through-hole electrodes has problems of the rise of the cost and the lowering of yield ratio, because of the reduction in the number of parts such as a bonding wire 3 and the number of processes as well as likely reduction in the mounting area to dispose electrodes for wiring connection, there exists an effect of being able to reduce the size of the module as compared with the mounting structures shown in the fifth and sixth embodiments.

Eighth Embodiment

Every one of the first to seventh embodiments of the present invention described in FIGS. 5, 12, 13, 29, 30, and 31 presupposes a case where power amps corresponding to a plurality of frequency bands and standards are formed by a plurality of semiconductor elements. However, the present embodiment shows a mounting structure of the case where, even if the power amps have some control circuits collected into RF-IC side, at least the power amp units are all formed within the same element for the plurality of frequency bands and standards, and sub-module including the RF-IC and power amp is laminated. This is common in the sectional views shown in FIGS. 32, 33, and 34.

The present embodiment will be described by using FIG. 32 or FIG. 33, or FIG. 34, and FIGS. 18, 23 and 28. As described above, in the present embodiment, the power amp is mainly collected into a second semiconductor element 702, and is laminated on a first semiconductor element 701 forming the RF-IC (or the RF-IC and baseband LSI or the RF-IC and baseband LSI and CPU) by flip-chip connection. In the present embodiment, there is no problem at all even if the second semiconductor element 702 is not only HBT but also a MOS transistor.

Figure 32:
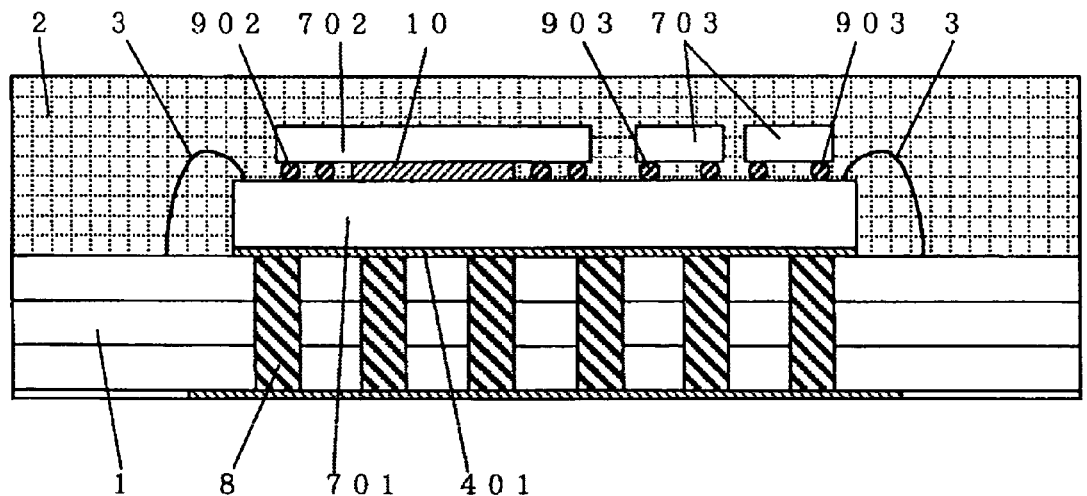
FIG. 32 is a sectional view showing another embodiment of the mounting structure of the power amplifier to be mounted on the mobile information terminal of the present invention.
Figure 33:
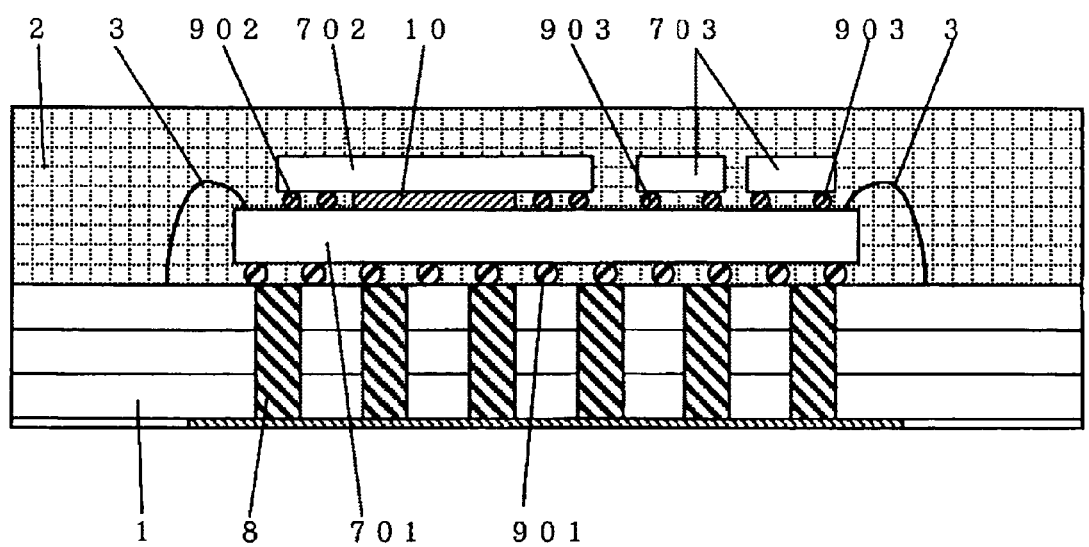
FIG. 33 is a sectional view showing another embodiment of the mounting structure of the power amplifier to be mounted on the mobile information terminal of the present invention.
Figure 34:
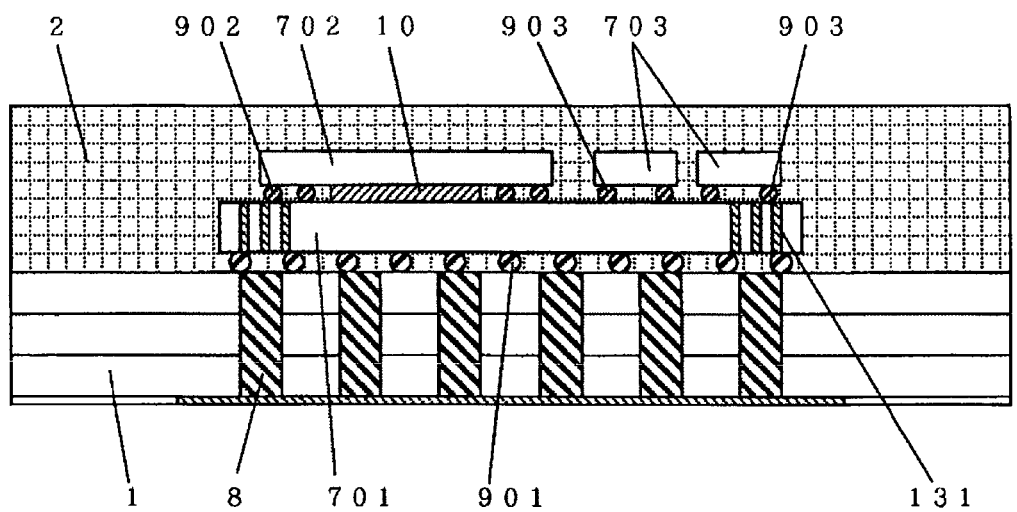
FIG. 34 is a sectional view showing another embodiment of the mounting structure of the power amplifier to be mounted on the mobile information terminal of the present invention.

In the sectional views shown in FIGS. 32, 33, and 34, though there exists a point of difference as to whether or not the first semiconductor element 701 is connected to a wiring substrate 1 by flip-chip connection and whether or not a bonding wire 3 is used for signal connection, in either case, it is characterized in that the first semiconductor element 701 including the RF-IC functions as a heat dissipation plate for the second semiconductor element 702 including the power amp.

Ninth Embodiment

Another embodiment of the present invention will be described by using FIG. 35 or FIG. 36 or FIG. 37. When the RF unit of a high frequency radio communication circuit is consolidated to one module, a sub-module having a relatively large heat generating loss similarly to a power amp (sub) module and a sub-module which deteriorates in characteristics when temperature fluctuation occurs within the module similarly to a filter (sub) module come to co-exist in the same package (module). As a result, there arises a necessity of realizing a mounting structure in which the heat generated from the power amp sub-module having a large heat value is difficult to transfer to the filter sub-module large in fluctuation of characteristics for temperature fluctuation, that is, large in temperature characteristics.

Figure 35:
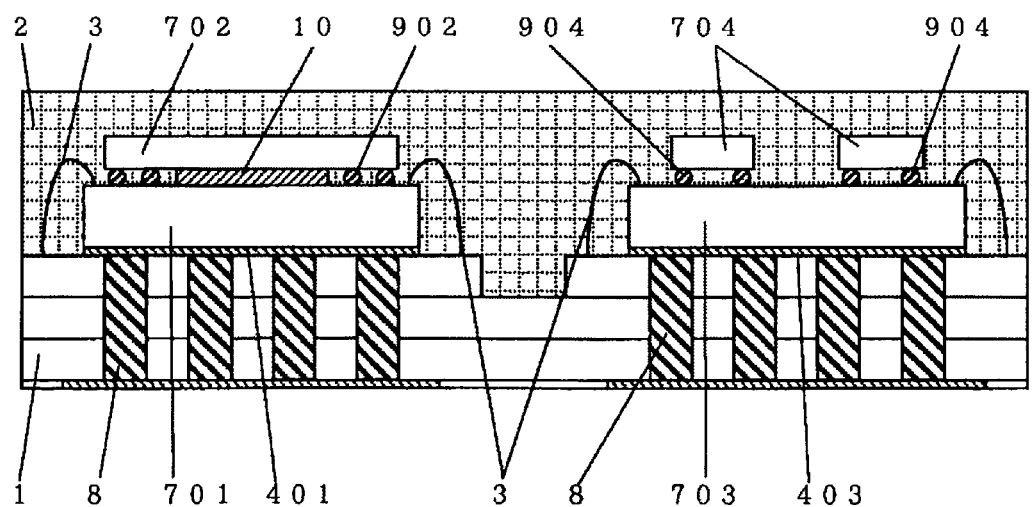
FIG. 35 is a sectional view showing another embodiment of the mounting structure of the power amplifier to be mounted on the mobile information terminal of the present invention.
Figure 36:
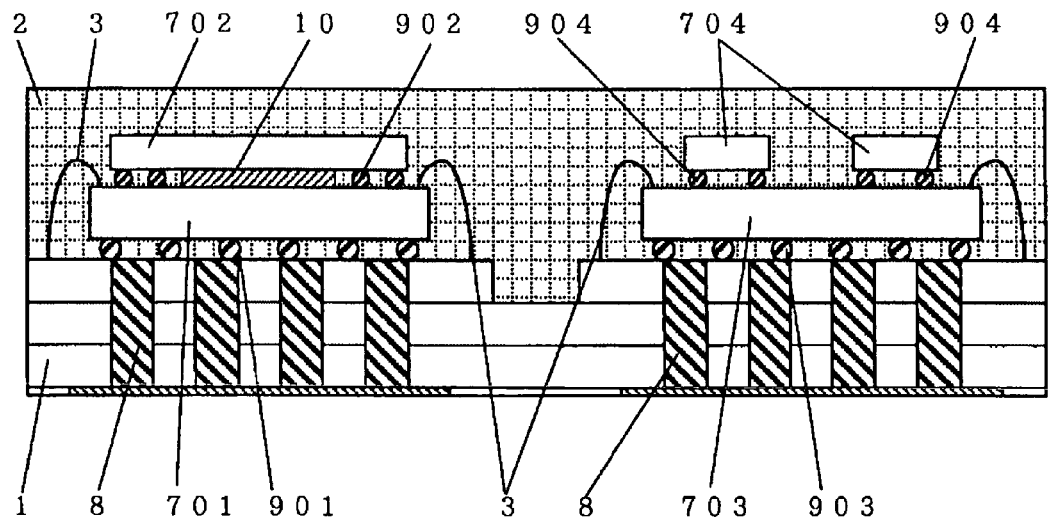
FIG. 36 is a sectional view showing another embodiment of the mounting structure of the power amplifier to be mounted on the mobile information terminal of the present invention.
Figure 37:
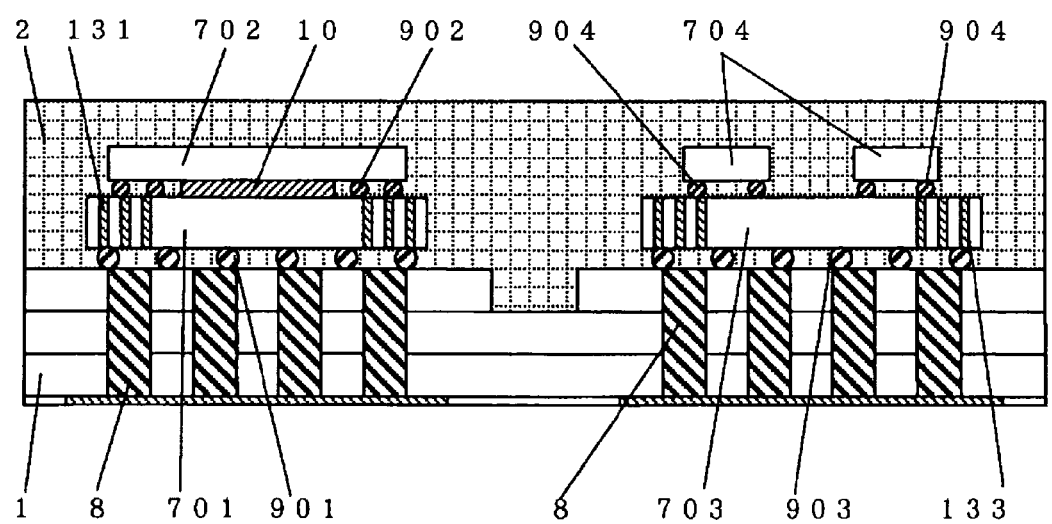
FIG. 37 is a sectional view showing another embodiment of the mounting structure of the power amplifier to be mounted on the mobile information terminal of the present invention.

In the sectional views of the present embodiment shown in FIG. 35 or FIG. 36 or FIG. 37, in either case, the wiring substrate 1 is divided into at least two island-shaped regions, and similarly to other embodiments of the present invention shown in the fifth to eighth embodiments, heat can be prevented from transferring by conduction from the second semiconductor element 702 constituting the power amp sub-module to a fourth semiconductor element 704 constituting the filter sub-module through the wiring substrate 1 and the wiring layer of the surface layer thereof. A fractured portion of the wiring substrate 1 is filled up with mold resin 2, but since heat conductance of the resin 2 is generally smaller than the effective heat conductance of the wiring substrate 1, it is possible to maintain heat dissipation properties of individual elements while enhancing heat insulating properties within the same module rather than the case where there exists no fracture portion.

Tenth Embodiment

Figure 38:
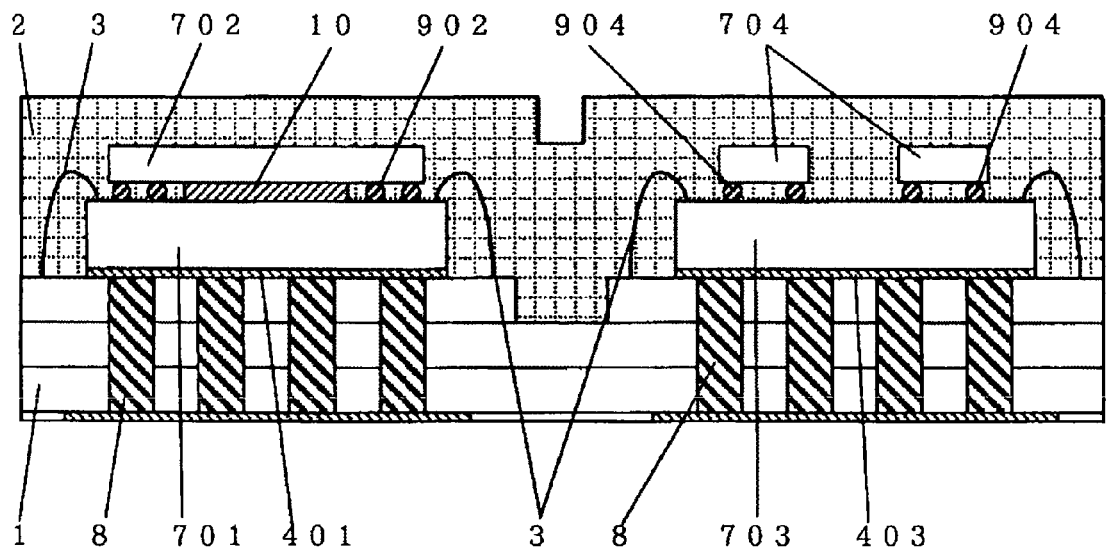
FIG. 38 is a sectional view showing another embodiment of the mounting structure of the power amplifier to be mounted on the mobile information terminal of the present invention.
Figure 39:
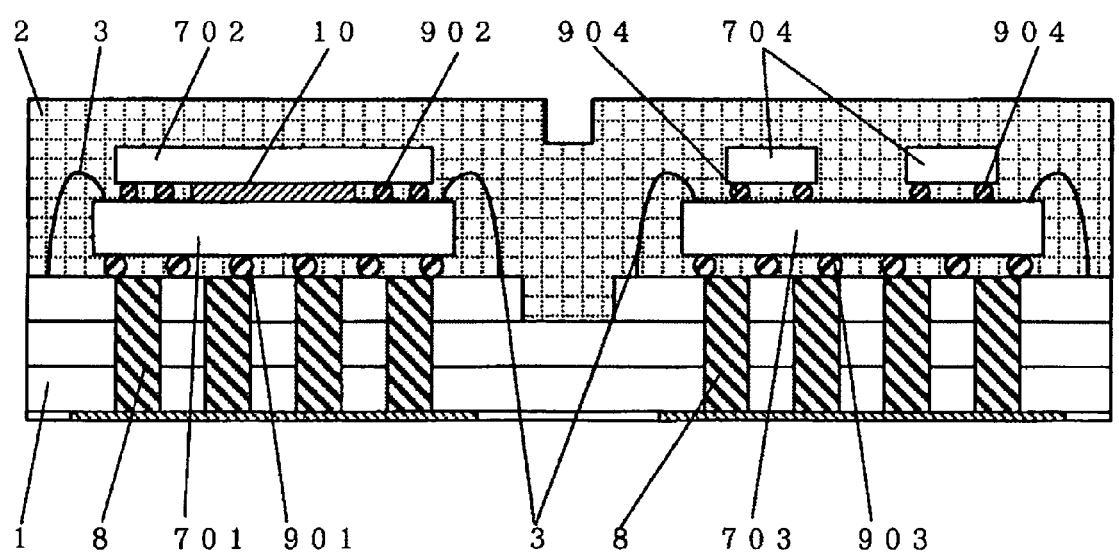
FIG. 39 is a sectional view showing another embodiment of the mounting structure of the power amplifier to be mounted on the mobile information terminal of the present invention.
Figure 40:
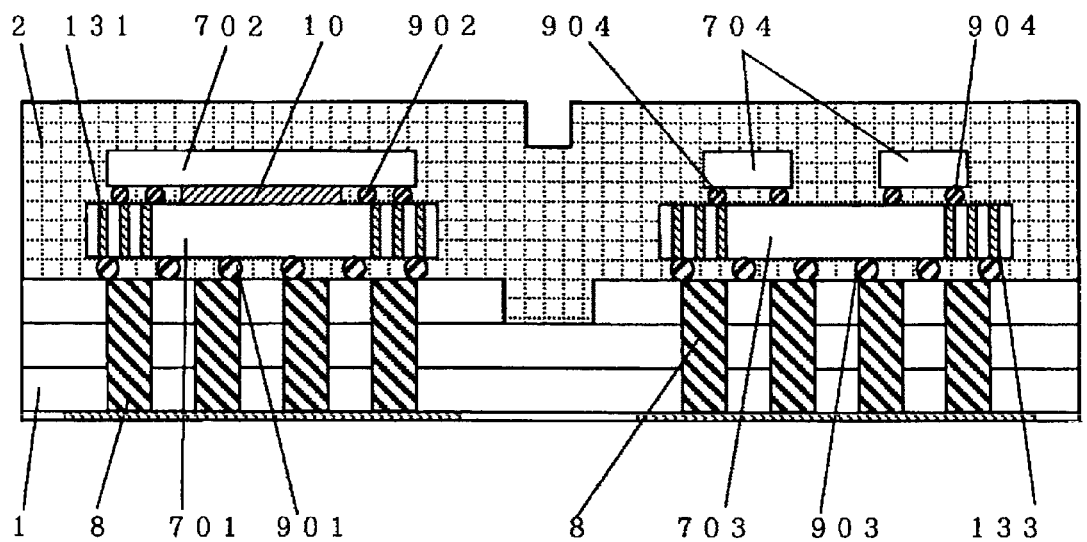
FIG. 40 is a sectional view showing another embodiment of the mounting structure of the power amplifier to be mounted on the mobile information terminal of the present invention.
Figure 41:
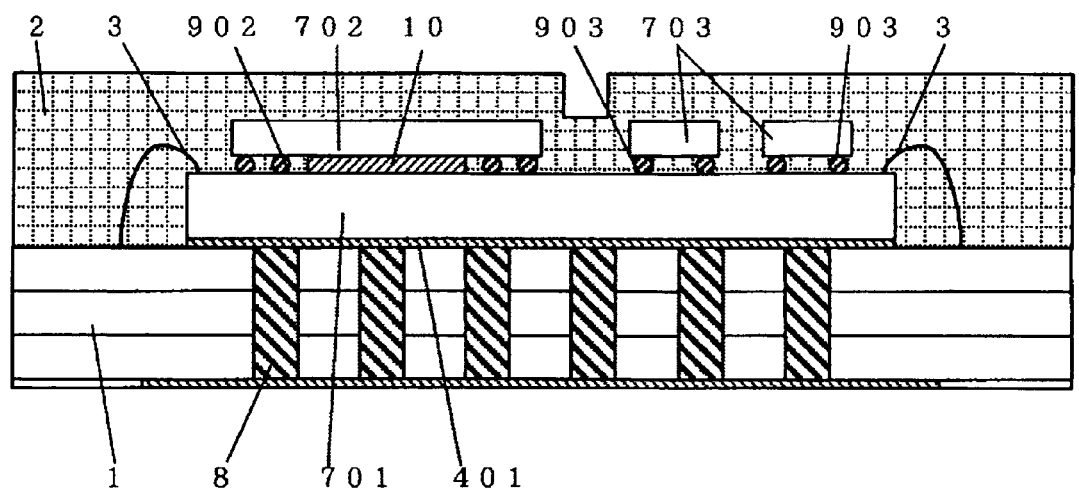
FIG. 41 is a sectional view showing another embodiment of the mounting structure of the power amplifier to be mounted on the mobile information terminal of the present invention.
Figure 42:
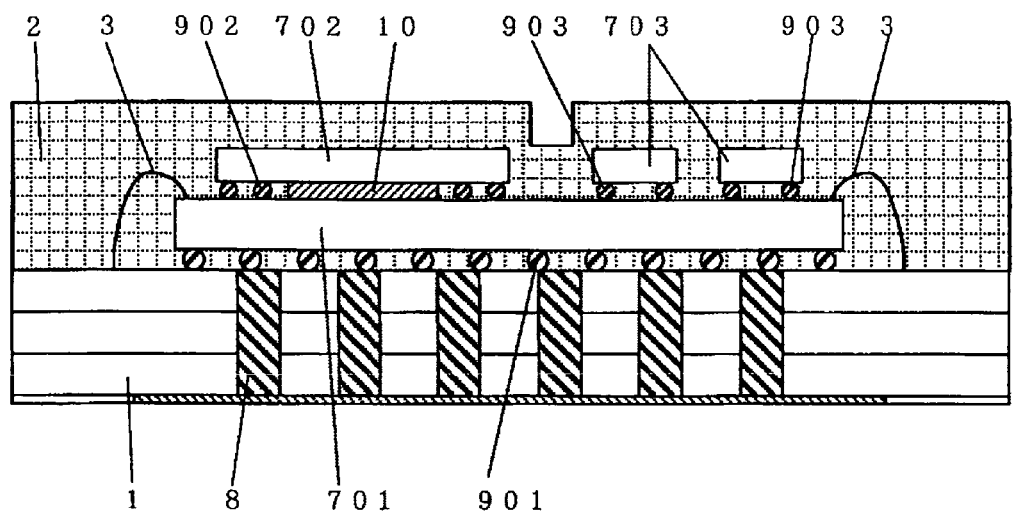
FIG. 42 is a sectional view showing another embodiment of the mounting structure of the power amplifier to be mounted on the mobile information terminal of the present invention.
Figure 43:
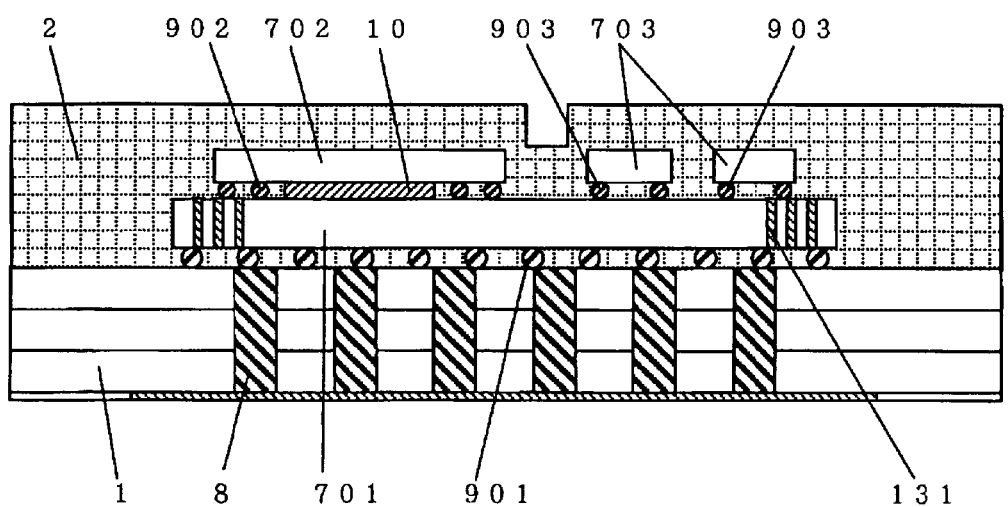
FIG. 43 is a sectional view showing another embodiment of the mounting structure of the power amplifier to be mounted on the mobile information terminal of the present invention.

Another embodiment of the present invention will be described by using FIG. 38 or FIG. 39 or FIG. 40. The present embodiment is characterized in that a depression or a groove is provided on the surface of a mold resin 2 in order to enhance heat insulating properties between a heating element (a second semiconductor element 702 constituting a power amp) within a module shown in the ninth embodiment and an element (a fourth semiconductor element 704 constituting a filter-borne sub-module) severe in temperature characteristics. Since the air of the environment in which the module is mounted and heat conductance of filling gas are expected to be much lower than the mold resin 2, it is possible to enhance heat insulating properties much more between the heating element and the element severe in temperature characteristics within the same module.

Eleventh Embodiment

Another embodiment of the present invention will be described by using FIG. 41 or FIG. 42 or FIG. 43 or FIG. 44. The present embodiment, similarly to the eighth embodiment, aims to enhance heat insulating properties between a heating element (a second semiconductor element 702 constituting a power amp) and an element (a third semiconductor element 703 constituting a filter-borne sub-module) severe in temperature characteristics in the case where a second semiconductor element 702 including a power amp and a third semiconductor element 703 including the filter borne sub-module are laminate-mounted in a parallel existence on the first semiconductor element 701 including a RF-IC.

As shown in FIGS. 41, 42, and 43 or FIG. 44, a mold resin 2 among the regions in which the second semiconductor element 702 laminate-mounted on the first semiconductor element 701 and the third semiconductor element 703 exist and which these elements is provided with a depression or a groove similarly to the tenth embodiment, so that the heat insulating properties between the heating element within the same module and the element severe in temperature characteristics can be enhanced.

Figure 44:
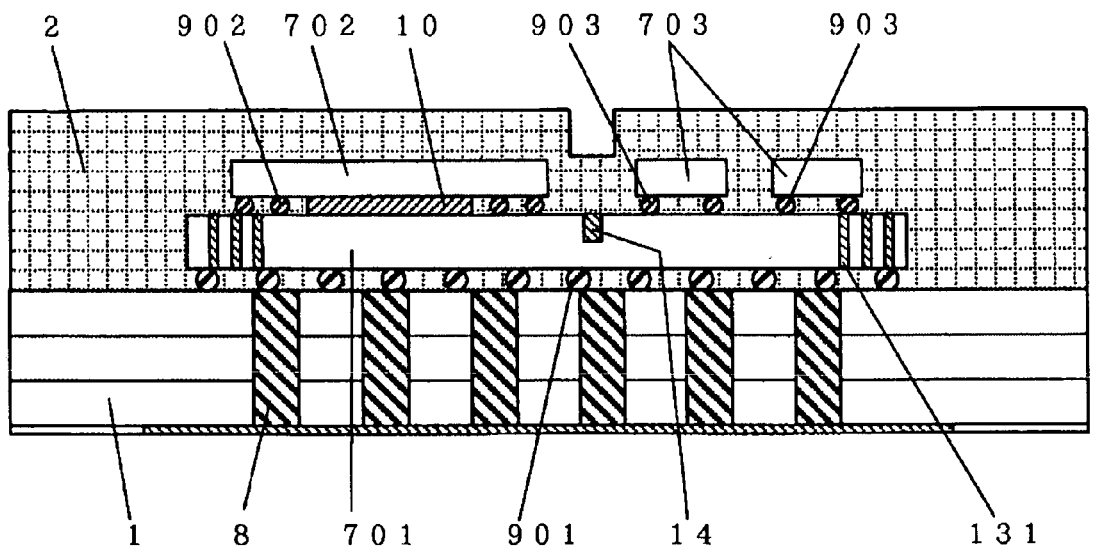
FIG. 44 is a sectional view showing another embodiment of the mounting structure of the power amplifier to be mounted on the mobile information terminal of the present invention.
Figure 45:
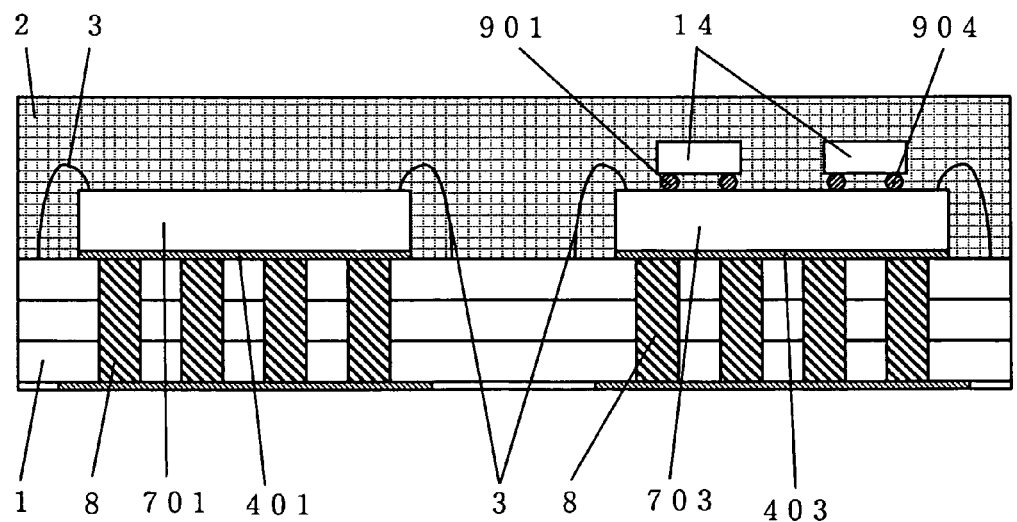
FIG. 45 is a sectional view showing another embodiment of the mounting structure of the power amplifier to be mounted on the mobile information terminal of the present invention.
Figure 46:
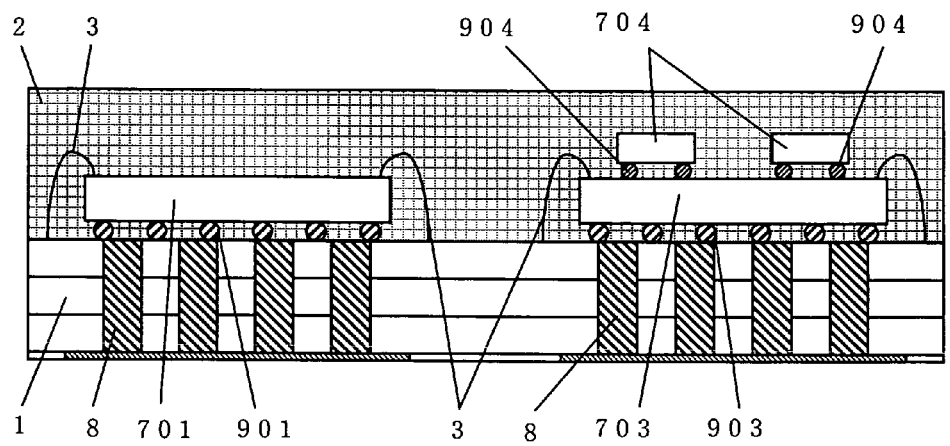
FIG. 46 is a sectional view showing another embodiment of the mounting structure of the power amplifier to be mounted on the mobile information terminal of the present invention.
Figure 47:
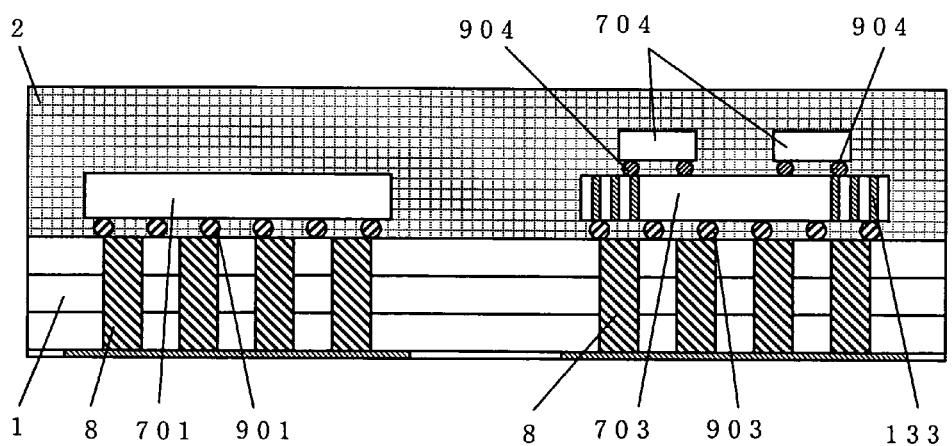
FIG. 47 is a sectional view showing another embodiment of the mounting structure of the power amplifier to be mounted on the mobile information terminal of the present invention.
Figure 48:
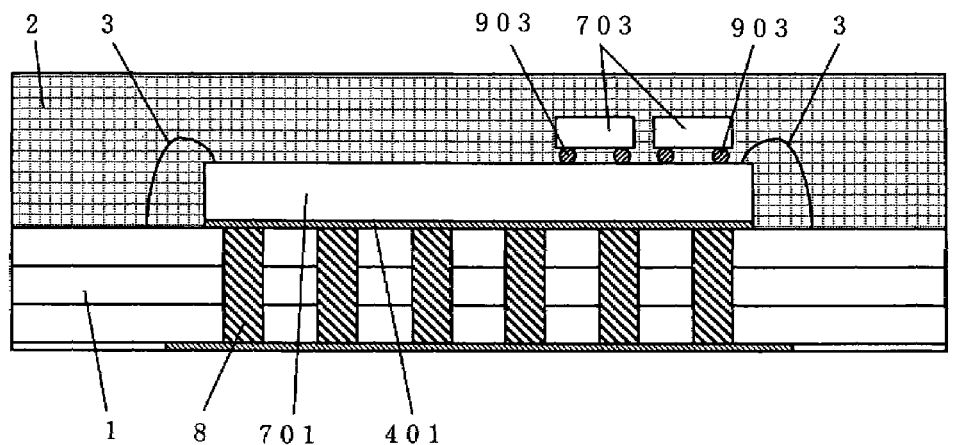
FIG. 48 is a sectional view showing another embodiment of the mounting structure of the power amplifier to be mounted on the mobile information terminal of the present invention.
Figure 49:
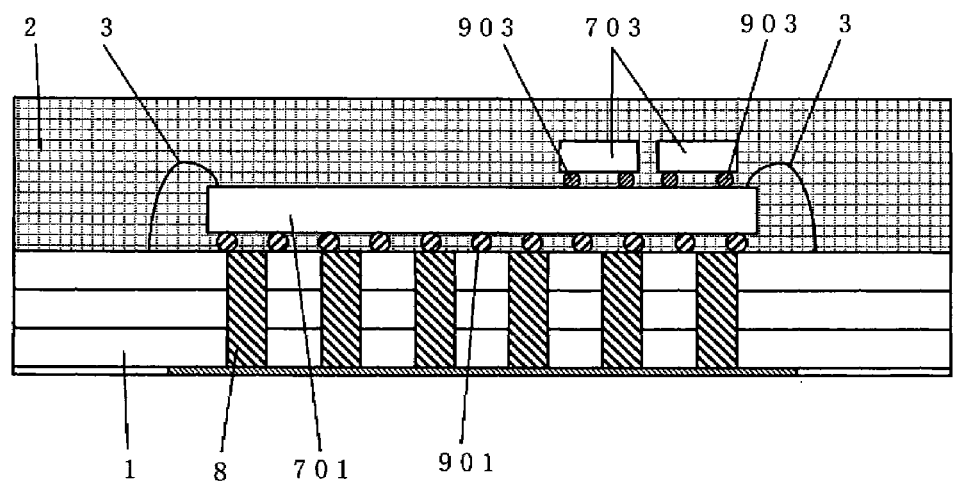
FIG. 49 is a sectional view showing another embodiment of the mounting structure of the power amplifier to be mounted on the mobile information terminal of the present invention.
Figure 50:
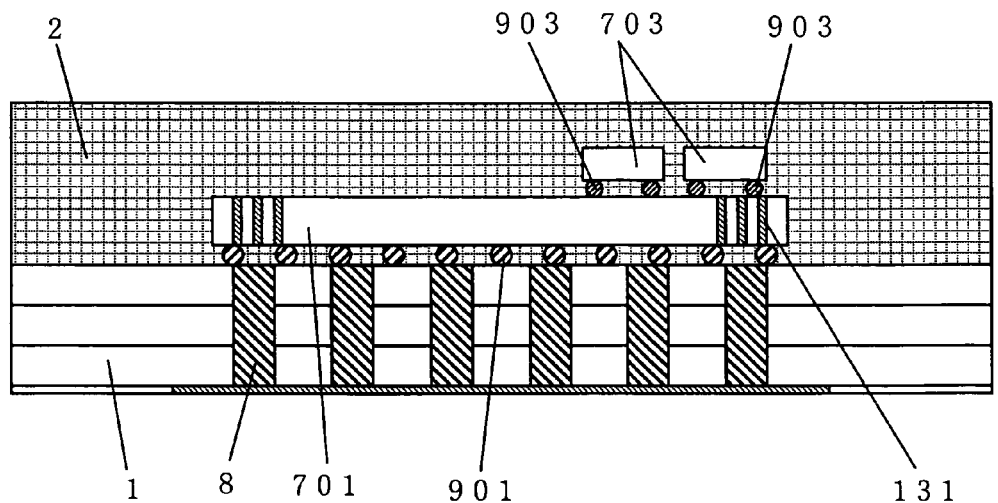
FIG. 50 is a sectional view showing another embodiment of the mounting structure of the power amplifier to be mounted on the mobile information terminal of the present invention.
Figure 51:
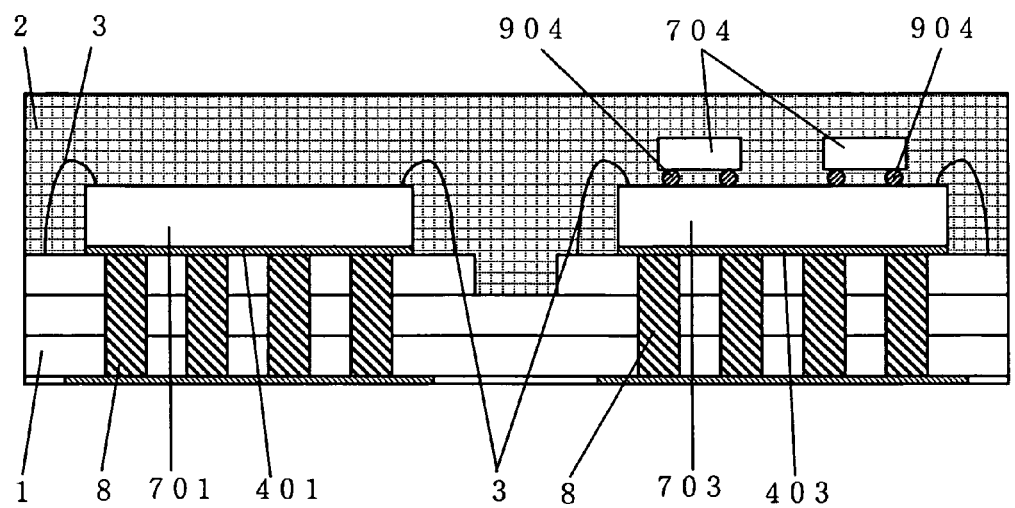
FIG. 51 is a sectional view showing another embodiment of the mounting structure of the power amplifier to be mounted on the mobile information terminal of the present invention.
Figure 52:
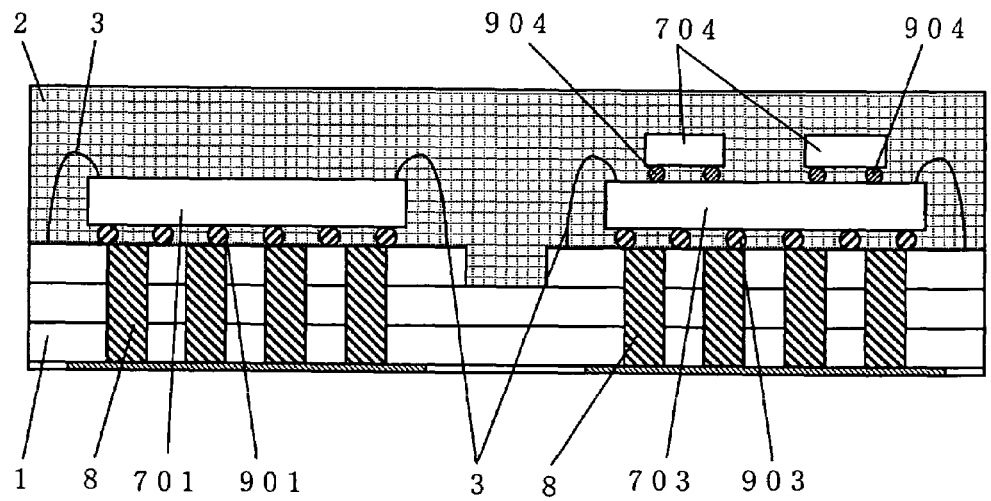
FIG. 52 is a sectional view showing another embodiment of the mounting structure of the power amplifier to be mounted on the mobile information terminal of the present invention.
Figure 53:
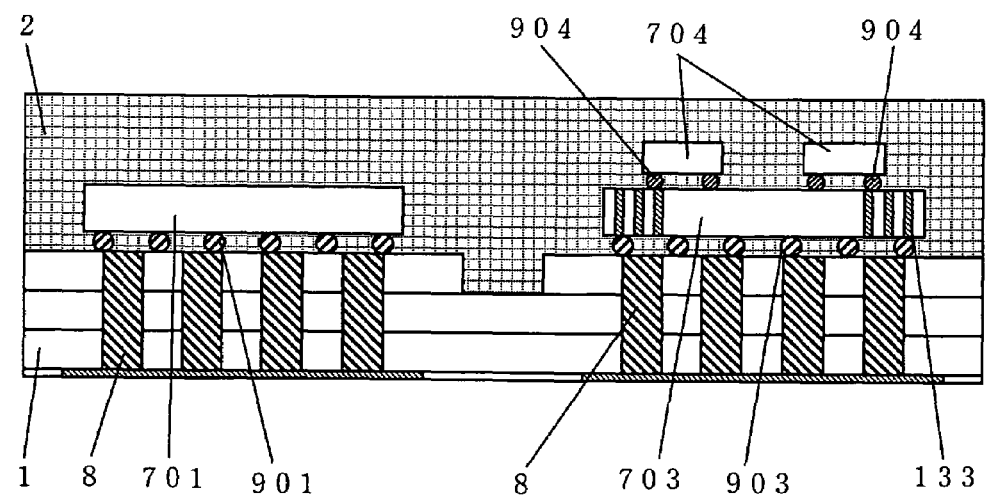
FIG. 53 is a sectional view showing another embodiment of the mounting structure of the power amplifier to be mounted on the mobile information terminal of the present invention.
Figure 54:
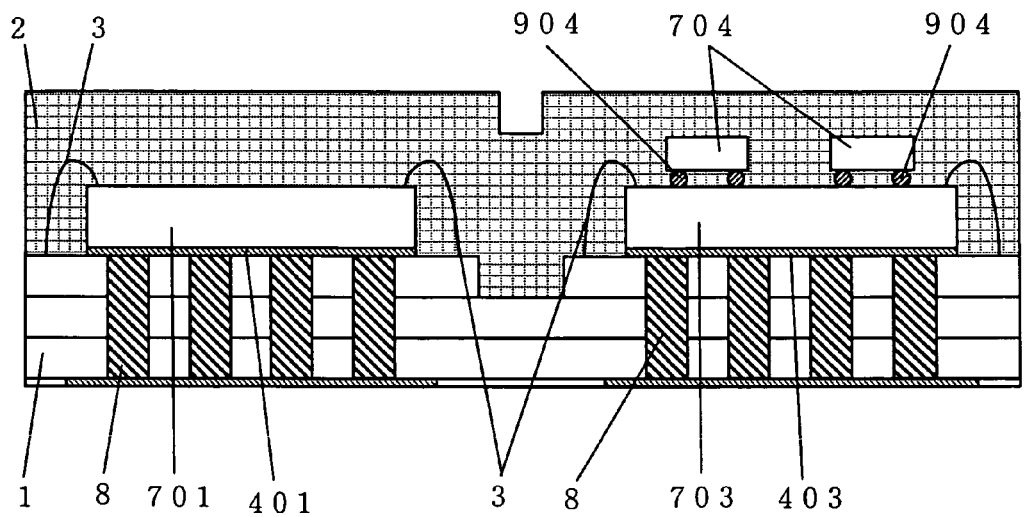
FIG. 54 is a sectional view showing another embodiment of the mounting structure of the power amplifier to be mounted on the mobile information terminal of the present invention.
Figure 55:
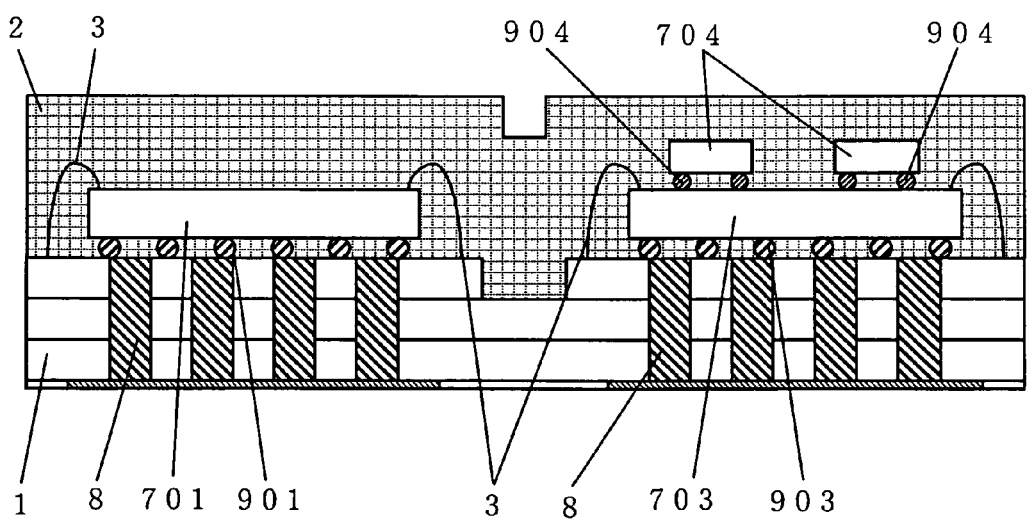
FIG. 55 is a sectional view showing another embodiment of the mounting structure of the power amplifier to be mounted on the mobile information terminal of the present invention.
Figure 56:
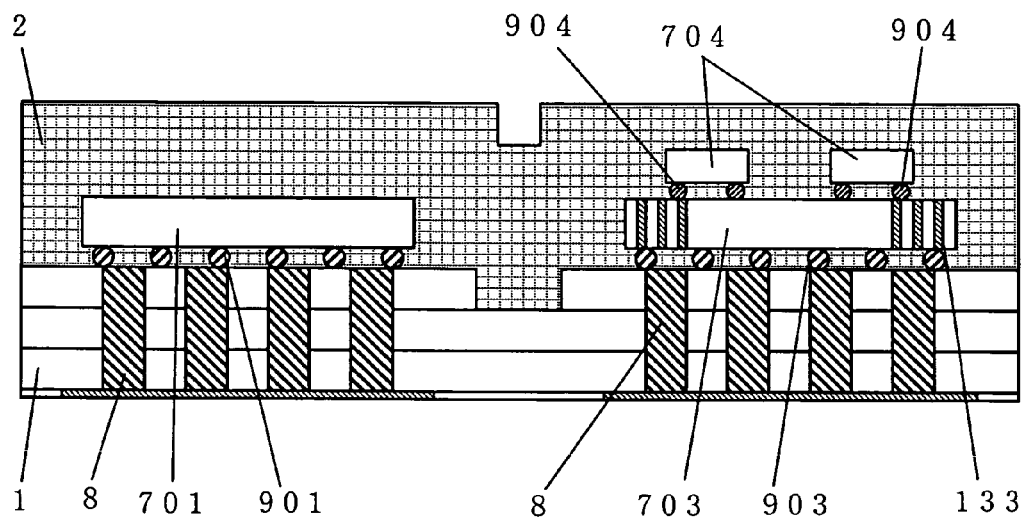
FIG. 56 is a sectional view showing another embodiment of the mounting structure of the power amplifier to be mounted on the mobile information terminal of the present invention.
Figure 57:
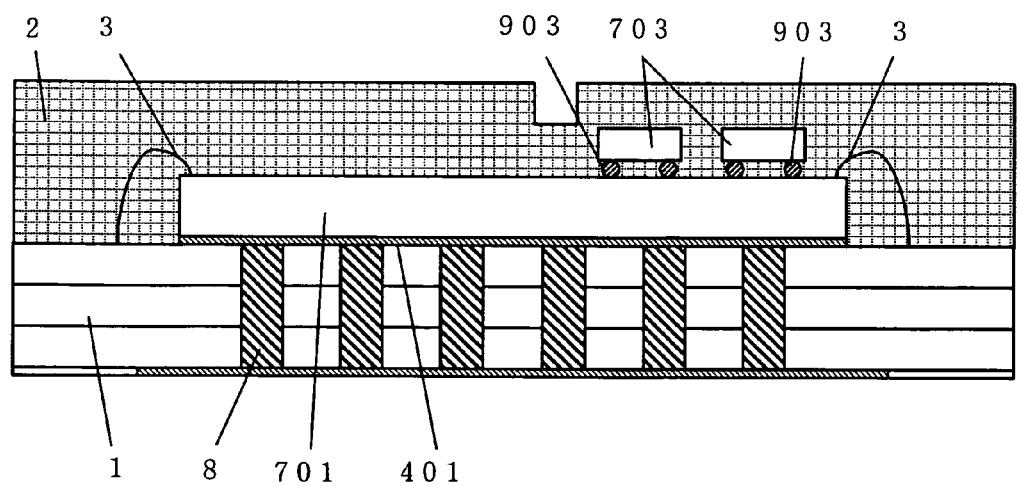
FIG. 57 is a sectional view showing another embodiment of the mounting structure of the power amplifier to be mounted on the mobile information terminal of the present invention.
Figure 58:
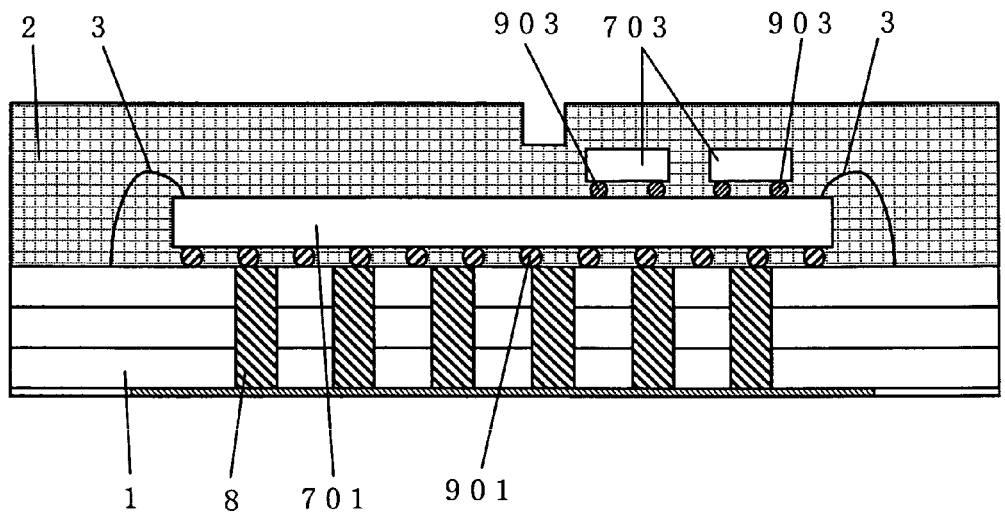
FIG. 58 is a sectional view showing another embodiment of the mounting structure of the power amplifier to be mounted on the mobile information terminal of the present invention.
Figure 59:
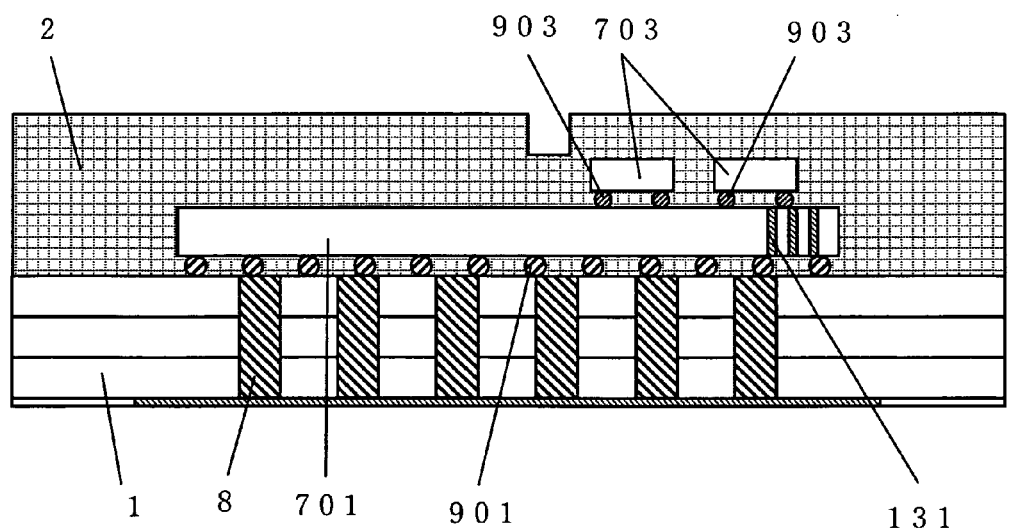
FIG. 59 is a sectional view showing another embodiment of the mounting structure of the power amplifier to be mounted on the mobile information terminal of the present invention.
Figure 60:
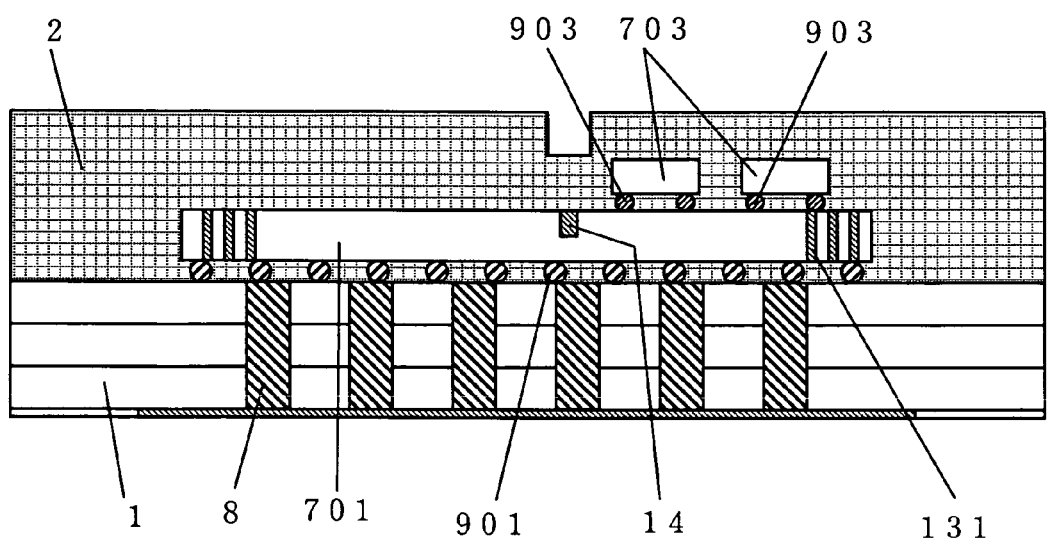
FIG. 60 is a sectional view showing another embodiment of the mounting structure of the power amplifier to be mounted on the mobile information terminal of the present invention.

Further, as shown in FIG. 44, a groove portion penetrating but not completely to the rear surface (the upper surface when mounting) of the first semiconductor element 701 is provided, so that the heat insulating properties within the element can be enhanced. It does not matter if this non-penetrating groove portion is not only a belt-like groove, but also disposed with a hole having some width and length in a broken line shape. Further, it does not matter if the groove portion is coated with the mold resin 2 after being coated with some material.

Twelfth Embodiment

Another embodiment of the present invention will be described by using FIG. 45 or FIG. 46 or FIGS. 47, 48, 49, 50, 51, 52, 53, 54, 55, 56, 57, 58, 59 or 60. The present embodiment is equivalent to the case where the functions of a second semiconductor element 702 are collected into a first semiconductor element 701 in the fifth to the eleventh embodiments as described by using FIGS. 29 to 44. In a high frequency radio communication circuit mounted on a mobile information terminal such as a mobile phone as described in the first to eleventh embodiments of the present invention, the case has been shown where a power amplifier (power amp) of a radio frequency unit is separated into the semiconductor element for power amplification and the semiconductor element for control, or the case has been shown where the power amp corresponding to a plurality of different frequency bands is separated into a plurality of semiconductor elements per each frequency band. However, there are some cases where the circuits of the power amp corresponding to all the frequency bands are collected into the first semiconductor element 701 or the cases where the functions of the RF-IC are also collected into the element 701. Even in such case, a mounting structure capable of dissipating a heat generating loss arisen from a power amp circuit forming unit to the outside of the module through the wiring substrate 1 in a short route can be provided by the present embodiment.

Further, in the present embodiment shown in FIGS. 54 to 60, to solve a problem that the heat arisen in a high heat generating region of the power amp circuit unit and the like of the first semiconductor element 701, that is, in the Figures, in the region of the semiconductor element 701 on which a third semiconductor element 703 is not mounted is transferred to the element (third semiconductor element 703 including the filter borne sub-module) severe in temperature characteristics, a groove is provided for a mold resin 2 or the wiring substrate 1, so that a sectional area of a heat dissipation route with a high heat generating unit of the first semiconductor element 701 is decreased, and the heat insulating properties among the elements can be also maintained high.

As described above, according to the present invention, in the high frequency radio communication circuit to be mounted in the mobile information terminal such as the mobile phone, a mounting structure can be provided in which the module including the power amp of the radio frequency unit is unable to simultaneously connect with a plurality of frequency bands and standards by radio communications, and therefore, the circuits corresponding to the plurality of frequency bands and standards are built up in a stacked state, and the semiconductor element close to the wiring substrate functions as the heat dissipation plate for the heating element at a position distant from the wiring substrate or board.

Further, according to the present invention, even in the case where the radio frequency integrated circuit (RF-IC) and the power amp are consolidated to the same module or in the case where the power amp unit and the RF-IC unit are disposed in parallel with the module as well as the case where the RF-IC and the power amp are laminated in a stacked state, the semiconductor element close to the wiring substrate functions as a heat diffusion plate for the heating element at a position far away from the wiring substrate, and therefore, on the conflicting request in terms of heat design of the element for multi-frequency bands and standards, module consolidation and high functionalization, and size saving, it is possible to reduce the size of the module and realize high-density mounting with suppressing temperature rise of the heating element.

What is claimed is:

1. A semiconductor device in which a second semiconductor element is laminated and mounted by flip chip connection in a stacked state on a first semiconductor element which is wire bonded on a wiring substrate,
wherein the first semiconductor element and second semiconductor element generate heat at different times, and the heat generating areas of the first semiconductor element and second semiconductor element comprise a mounting structure included in a superposed arrangement seen from a vertical direction from a main circuit surface of the wiring substrate wherein the first semiconductor element is a lateral diffusion metal oxide film semiconductor (LDMOS) formed on a silicon substrate, and the second semiconductor element is a hetero junction bipolar transistor (HBT) formed on a substrate from one of gallium arsenide and silicon germanium, and wherein the first semiconductor element and second semiconductor element are power amplifiers used in current amplification in a high frequency radio communication circuit, and the second semiconductor element mainly constitutes a current amplifier circuit, and the first semiconductor element mainly constitutes a circuit to control current amplification of the second semiconductor element.

2. The semiconductor device according to claim 1,
wherein the first semiconductor element is wider in area in the direction parallel to a main circuit surface of the wiring substrate than the second semiconductor element.

3. The semiconductor device according to claim 1,
wherein the first semiconductor element and second semiconductor element are power amplifiers used in current amplification in a high frequency radio communication circuit, and the first semiconductor element and the second semiconductor element are power amplifiers corresponding to different frequency bands and communication standards of at least one or more types.

4. A semiconductor device in which a second semiconductor element is laminated and mounted by flip chip connection in a stacked state on a first semiconductor element which is wire bonded on a wiring substrate,
wherein the first semiconductor element and second semiconductor element generate heat at different times, and when the second semiconductor element performs a heat generating operation, the first semiconductor element having a heat diffusion plate diffuses a heat generating loss arisen from the second semiconductor element in the direction parallel with a main circuit surface of the wiring substrate wherein the first semiconductor element is a lateral diffusion metal oxide film semiconductor (LDMOS) formed on a silicon substrate, and the second semiconductor element is a hetero junction bipolar transistor (HBT) formed on a substrate from one of gallium arsenide and silicon germanium, and wherein the first semiconductor element and second semiconductor element are power amplifiers used in current amplification in a high frequency radio communication circuit, and the second semiconductor element mainly constitutes a current amplifier circuit, and the first semiconductor element mainly constitutes a circuit to control current amplification of the second semiconductor element.

5. The semiconductor device according to claim 4,
wherein the first semiconductor element is wider in area in the direction parallel to a main circuit surface of the wiring substrate than the second semiconductor element.

6. The semiconductor device according to claim 4,
wherein the first semiconductor element and second semiconductor element are power amplifiers used in current amplification in a high frequency radio communication circuit, and the first semiconductor element and the second semiconductor element are power amplifiers corresponding to different frequency bands and communication standards of at least one or more types.

* * * * *